(12) United States Patent
Nakatsu et al.

(10) Patent No.: US 7,285,436 B2
(45) Date of Patent: Oct. 23, 2007

(54) METHOD OF MANUFACTURING A SEMICONDUCTOR LIGHT-EMITTING DEVICE

(75) Inventors: Hiroshi Nakatsu, Tenri (JP); Takahisa Kurahashi, Kashiba (JP); Tetsuroh Murakami, Tenri (JP); Shouichi Ooyama, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 243 days.

(21) Appl. No.: 10/919,270

(22) Filed: Aug. 17, 2004

(65) Prior Publication Data

US 2005/0012456 A1 Jan. 20, 2005

Related U.S. Application Data

(62) Division of application No. 10/241,728, filed on Sep. 12, 2002, now Pat. No. 6,794,688.

(30) Foreign Application Priority Data

| Sep. 13, 2001 | (JP) | ............................ 2001-278104 |
| Aug. 12, 2002 | (JP) | ............................ 2002-234781 |

(51) Int. Cl.
*M01L 21/00* (2006.01)

(52) U.S. Cl. ............................ 438/38; 438/26; 438/33; 257/88

(58) Field of Classification Search .................. 438/22, 438/26, 33, 38; 257/88
See application file for complete search history.

(56) References Cited

U.S. PATENT DOCUMENTS

| 5,406,095 A | 4/1995 | Koyama et al. |
| 5,517,039 A | 5/1996 | Holonyak, Jr. et al. |
| 5,917,202 A | 6/1999 | Haitz et al. |
| 6,046,465 A | 4/2000 | Wang et al. |
| 6,054,726 A | 4/2000 | Ogihara et al. |

FOREIGN PATENT DOCUMENTS

JP 2003-209282 A 7/2003

OTHER PUBLICATIONS

"Hydrolyzation Oxidation of $Al_xGa_{1-x}As$-GaAs Quantum Well Heterostructures and Superlattices" by J.M. Dallesasse et al.; *Applied Physics Letters* 57, p. 2844-2846, c. 1990.
"*Low Threshold Half-Wave Vertical-Cavity Lasers*" by D. L. Huffaker et al.; Electronics Letters, vol. 30, No. 23, p. 1946-1947, c. 1994.
Kenichi Iga et al., "Fundamentals and Applications of Plane Emission Laser" Kyoritsu Shuppan K.K., Jun. 1999, pp. 105-113.

*Primary Examiner*—Douglas M. Menz
(74) *Attorney, Agent, or Firm*—Morrison & Foerster LLP

(57) ABSTRACT

A semiconductor light-emitting device exhibits high reflectance even with less number of pairs of light-reflecting layers, and allows light emitted from the active layer to be effectively extracted outside. This semiconductor light-emitting device is fabricated at good mass productivity by a semiconductor light-emitting device manufacturing method including the step of providing an active layer which generates light having a specified wavelength on a semiconductor substrate. On the semiconductor substrate, are stacked an $Al_xGa_{1-x}As$ layer and the active layer, in this order. Part of the $Al_xGa_{1-x}As$ layer with respect to the is changed into an $AlO_y$ layer (where y is a positive real number).

5 Claims, 13 Drawing Sheets

METHOD OF MANUFACTURING A SEMICONDUCTOR LIGHT-EMITTING DEVICE

This application is a division of Ser. No. 10/241,728, filed Sep. 12, 2002 now U.S. Pat. No. 6,794,688, which is a non-provisional application claiming priority from Japanese Application No. 2001-278104, filed Sep. 13, 2001 and Japanese Application No. 2002-234781, filed Aug. 12, 2002. These prior applications are hereby incorporated by reference.

BACKGROUND OF THE INVENTION

The present invention relates to a semiconductor light-emitting device such as light-emitting diodes to be used for display, optical communications and the like, and also to a manufacturing method therefor. The invention further relates to an LED lamp and an LED display, whichever is equipped with such a semiconductor light-emitting device.

In recent years, there have been developed high-intensity light-emitting diodes (LEDs) which emit light of infrared to blue wavelengths. This is based on the fact that the crystal growth technique for direct-transition group III-V compound semiconductor materials has been improved dramatically so that crystal growth has become implementable for almost any semiconductor that belongs to the group III-V compound semiconductors. LEDs using these direct-transition materials, by virtue of their capability of high-output, high-intensity emission, have come to be widely used as high-intensity LED lamps such as outdoor display boards, display-use light sources such as indicator lamps for portable equipment of low power consumption, and light sources for optical transmission and optical communications by plastic optical fibers.

As a new high-output, high-intensity LED of this type, there has been known an LED using AlGaInP-based material as shown in FIG. 11. This LED is fabricated by the following process. That is, On an n-type GaAs substrate 1, are stacked one after another:
an n-type GaAs buffer layer 2;
a distributed Bragg reflector layer (dopant concentration: $5 \times 10^{17}$ cm$^{-3}$) 4 made of a multilayer film in which n-type $(Al_xGa_{1-x})_{0.51}In_{0.49}P$ (x=0.45) and n-type $Al_{0.51}In_{0.49}P$ are stacked alternately;
an n-type $(Al_xGa_{1-x})_{0.51}In_{0.49}P$ lower cladding layer (0≦x≦1, e.g. x=1.0; thickness: 1.0 μm; dopant concentration: $5 \times 10^{17}$ cm$^{-3}$) 5;
a p-type $(Al_xGa_{1-x})_{0.51}In_{0.49}P$ active layer (0≦x≦1, e.g. x=0.42; thickness: 0.6 μm; dopant concentration: $1 \times 10^{17}$ cm$^{-3}$) 6; and
a p-type $(Al_xGa_{1-x})_{0.51}In_{0.49}P$ upper cladding layer (0≦x≦1, e.g. x=1.0; thickness: 1.0 μm; dopant concentration: $5 \times 10^{17}$ cm$^{-3}$) 7,
and further thereon are formed:
a p-type $(Al_xGa_{1-x})_vIn_{1-v}P$ intermediate layer (x=0.2; v=0.4; thickness: 0.15 μm; dopant concentration: $1 \times 10^{18}$ cm$^{-3}$) 8;
a p-type $(Al_xGa_{1-x})_vIn_{1-v}P$ current spreading layer (x=0.05; v=0.05; thickness: 1.5 μm; dopant concentration: $5 \times 10^{18}$ cm$^{-3}$) 10; and
an n-type GaP current blocking layer (thickness: 0.3 μm; dopant concentration: $1 \times 10^{18}$ cm$^{-3}$) 9.

Thereafter, the n-type GaP current blocking layer 9 is subjected to selective etching by normal photolithography process so that a 50 μm to 150 μm-dia. portion thereof shown in the figure is left while its surrounding portions are removed. A p-type $(Al_xGa_{1-x})_vIn_{1-v}P$ current spreading layer (x=0.05; v=0.95; thickness: 7 μm; dopant concentration $5 \times 10^{18}$ cm$^{-3}$) 10 is regrown in such a manner as to cover the top of the p-type $(Al_xGa_{1-x})_vIn_{1-v}P$ current spreading layer, which has been exposed by removing the n-type GaP current blocking layer 9, as well as the n-type GaP current blocking layer 9.

Finally, on the p-type current spreading layer 10 is deposited, for example, a Au—Be film. This film is patterned into a circular form, for example, so as to be inverse to the light-emitting region, thereby forming a p-type electrode 12. Meanwhile, on the lower surface of the GaAs substrate 1 is formed, for example, an n-type electrode 11 made of a Au—Zn film by deposition.

It is noted here that, for simplicity' sake, the ratio x of Al to Ga, the ratio v of totaled Al and Ga to the other group III elements, or the like will be omitted as appropriate in the following description.

With respect to the p-type AlGaInP current spreading layer 10, the Al composition "x" and the In composition (1-v) are set low, as already described, so that the current spreading layer becomes transparent to the emission wavelength range 550 nm-670 nm of this AlGaInP-based LED, low in resistivity, and makes ohmic contact with the p-side electrode (i.e., x=0.05, v=0.95). In the AlGaInP-based LED, normally, Si is used as the n-type dopant, and Zn is used as the p-type dopant. Also, the conductive type of the active layer is normally the p type.

As the substrate for $(Al_xGa_{1-x})_vIn_{1-v}P$-based LEDs, normally, a GaAs substrate is used so as to obtain lattice matching with materials of individual layers. However, the GaAs substrate has a band gap of 1.42 eV, lower than those of $(Al_xGa_{1-x})_vIn_{1-v}P$-based semiconductors, so that the GaAs substrate would absorb light emission of 550 nm to 670 nm, which is a wavelength range of $(Al_xGa_{1-x})_vIn_{1-v}P$-based semiconductors. Therefore, out of light emitted from the active layer, the light emitted toward the substrate side would be absorbed within the chip, and could not be extracted outside. Accordingly, for $(Al_xGa_{1-x})_vIn_{1-v}P$-based LEDs, with a view to fabricating a high-efficiency, high-intensity LED, it is important to provide a DBR (distributed Bragg reflector) layer 4 in which low-refractive-index layer and high-refractive-index layer are combined one after another between the GaAs substrate 1 and the active layer 6 as shown in FIG. 11 so as to obtain an enhanced reflectance through multiple reflection. In this example of FIG. 11, $(Al_{0.65}Ga_{0.35})_{0.51}In_{0.49}P$ (refractive index: 3.51) that does not absorb the emission wavelength 570 nm of the active layer is selected as the high-refractive-index material, and $Al_{0.51}In_{0.49}P$ (refractive index: 3.35) is selected as the low-refractive-index material, while optical film thicknesses of the individual low-refractive-index layer and high-refractive-index layer are set to λ/4 relative to an emission wavelength of λ. These materials are stacked alternately to an extent of 10 pairs so as to be enhanced in reflectance, by which the total photoreflection-layer reflectance is set to about 50%. In a case where such an AlGaInP-based light-reflecting layer is provided, reflectance characteristics against the number of pairs are shown in FIG. 13A. The expression "AlInP/Q(0.4)" in the figure indicates a characteristic with the use of a pair of $(Al_{0.65}Ga_{0.35})_{0.51}In_{0.49}P$ and $Al_{0.51}In_{0.49}P$. Similarly, the expression "AlInP/Q(0.5)" indicates a characteristic with the use of a pair of $(Al_{0.55}Ga_{0.45})_{0.51}In_{0.49}P$ and $Al_{0.51}In_{0.49}P$ With this light-reflecting layer adopted, the chip luminous intensity can be improved from 20 mcd to 35 mcd, compared with the case where no light-reflecting layer is provided.

As is well known, if the layer thickness of crystals is "d" and the refractive index is "n," then the optical film thickness is given by "nd."

As shown in FIG. 12, in $(Al_xGa_{1-x})_yIn_{1-y}P$-based LEDs is used a light-reflecting layer 14 which is formed by stacking a pair of $Al_xGa_{1-x}As$ and AlAs and which has lattice matching with the GaAs substrate. In a case where such an AlGaAs-based light-reflecting layer 14 is provided, reflectance characteristics against the number of pairs are shown in FIG. 13B. In the figure, a broken line expressed as "$Al_{0.60}$" shows a characteristic with the provision of a light-reflecting layer which is formed by selecting $Al_{0.65}Ga_{0.35}As$ (refractive index: 3.66), which does not absorb the emission wavelength 570 nm of the active layer, as the high-refractive-index material and selecting AlAs (refractive index: 3.10) as the low-refractive-index material, and then stacking alternately these materials as a pair. Similarly, a broken line expressed as "$Al_{0.70}$" in the figure shows a characteristic with the use of a pair of $Al_{0.70}Ga_{0.30}As$ and AlAs, and a solid line expressed as "$Al_{0.75}$" in the figure shows a characteristic with the use of a pair of $Al_{0.65}Ga_{0.35}As$ and AlAs. As a result of this, in the case where $Al_{0.65}Ga_{0.35}As$ (refractive index: 3.66) is selected as the high-refractive-index material and AlAs (refractive index: 3.10) is selected as the low-refractive-index material, it becomes possible to provide a larger difference in refractive index than in the case shown in FIG. 13A, where the total reflectance of the light-reflecting layer can be made to be about 60%. With this light-reflecting layer adopted, the chip luminous intensity can be improved from 20 mcd to 40 mcd, compared with the case where no light-reflecting layer is provided.

In this connection, as can be understood from FIGS. 13A and 13B, in order to obtain a high reflectance of 90% or more, which allows the luminous intensity to be improved double or more, the number of semiconductor layer pairs constituting the light-reflecting layer 4, 14 needs to be 30 or more. This is due to very small differences in refractive index, which are 0.18 in the case of $(Al_xGa_{1-x})_{0.51}In_{0.49}P$ (x=0.45)/$Al_{0.51}In_{0.49}P$ and 0.32 or so in the case of AlAs/$Al_xGa_{1-x}As$.

However, providing a pair number of 30 or more would cause the growth time to be prolonged, which would lead to lower mass-productivity. Also, small differences in refractive index would cause the half-value width of the reflection spectrum to be narrowed, where only a slight change in layer thickness of the light-reflecting layer would cause the reflection spectrum to be largely shifted, making it difficult to obtain a matching between emission wavelength and light-reflecting layer, which would lead to lower reproducibility and so lower mass-productivity. Further, with the number of pairs increased, the light-reflecting layer alone would take a layer thickness as thick as 3 μm or more, where the substrate after epitaxial growth would be liable to warp or deformation, making it difficult to subject the substrate to subsequent processes.

These circumstances are the same also with semiconductor light-emitting devices using other various materials without being limited to the AlGaInP-based materials.

SUMMARY OF THE INVENTION

Accordingly, an object of the present invention is to provide a semiconductor light-emitting device capable of effectively extracting light emitted from the active layer to the external.

Another object of the present invention is to provide a semiconductor light-emitting device manufacturing method capable of fabricating such semiconductor light-emitting devices with high mass-productivity.

Still further object of the present invention is to provide an LED lamp and LED display equipped with such semiconductor light-emitting devices.

In order to achieve the above object, the semiconductor light-emitting device of the present invention has the following constitution. That is, the semiconductor light-emitting device of the present invention is formed by stacking, on a semiconductor substrate, a plurality of layers including an active layer made of a semiconductor which generates light of a specified wavelength. Furthermore, the semiconductor light-emitting device comprises a first light-reflecting layer provided between the semiconductor substrate and the active layer and having a main reflecting part including a dielectric containing Al or space and a sub reflecting part made of a semiconductor layer containing Al.

In the semiconductor light-emitting device of this invention, between the semiconductor substrate and the active layer is a first light-reflecting layer having a main reflecting part including a dielectric containing Al or space and a sub reflecting part made of a semiconductor layer containing Al. The main reflecting part of this first light-reflecting layer, by virtue of its including an dielectric containing Al or space, becomes lower in refractive index "n" than the sub reflecting part formed of a semiconductor layer containing Al. Accordingly, light emitted by the active layer is reflected at a high reflectance by the main reflecting part of the first light-reflecting layer. If the main reflecting part of the first light-reflecting layer is disposed at a necessary region, e.g., at a region where the electrode is absent on the active layer, then the light emitted by the active layer is reflected by the main reflecting part of the first light-reflecting layer so as to go outside without being interrupted by the electrode. Therefore, light emitted from the active layer can be extracted outside effectively.

In one embodiment, the semiconductor light-emitting device further comprises a second light-reflecting layer provided between the first light-reflecting layer and the active layer and formed by stacking a plurality of pairs of a low-refractive-index material layer and a high-refractive-index material layer.

In the semiconductor light-emitting device of this one embodiment, between the first light-reflecting layer and the active layer is a second light-reflecting layer formed by stacking a plurality of pairs of a low-refractive-index material layer and a high-refractive-index material layer. Therefore, light emitted from the active layer can be extracted outside further effectively. Also, by virtue of a low refractive index "n" of the main reflecting part of the first light-reflecting layer, a high reflectance can be obtained even with a small number of pairs of the second light-reflecting layer.

Desirably, the second light-reflecting layer is a distributed Bragg reflector (DBR).

In one embodiment of the semiconductor light-emitting device, the semiconductor substrate is of a first conductive type, and a second-conductive-type current spreading layer is provided on the active layer. The semiconductor light-emitting device further comprises a first-conductive-type current blocking layer provided at a specified region inside the current spreading layer, and an electrode layer provided on an top surface of the current spreading layer and at a region corresponding to the current blocking layer. Furthermore, the sub reflecting part of the first light-reflecting layer is disposed at a region corresponding to the current blocking layer, and the main reflecting part of the first light-reflecting layer is disposed at a region corresponding to surroundings of the current blocking layer.

In the semiconductor light-emitting device of this one embodiment, electric current injected from the electrode layer into the current spreading layer is interrupted by the current blocking layer provided at a specified region inside the current spreading layer, and thus flows in more part to the surrounding region of the current blocking layer. As a result, light emission occurs more in a portion of the active layer corresponding to the surroundings of the current blocking layer. Since the main reflecting part of the first light-reflecting layer is disposed at a region corresponding to the surroundings of the current blocking layer, light emitted at the portion of the active layer corresponding to the surroundings of the current blocking layer is reflected by the main reflecting part of the first light-reflecting layer so as to go outside without being interrupted by the electrode. Therefore, light emitted from the active layer can be extracted outside effectively.

In one embodiment of the semiconductor light-emitting device, the sub reflecting part of the first light-reflecting layer is formed of any one kind of semiconductor selected from among $Al_xGa_{1-x}As$, $(Al_xGa_{1-x})_yIn_{1-y}P$, $(Al_xGa_{1-x})_yIn_{1-y}N$, $(Al_xGa_{1-x})_yIn_{1-y}As$, and $(Al_xGa_{1-x})_yIn_{1-y}Sb$ (where $0<x\leq 1$ and $0<v<1$), and the main reflecting part of the first light-reflecting layer is formed of $AlO_y$ (where y is a positive real number) or space.

Herein, aluminium oxide is expressed uniformly as $AlO_y$, and $AlO_y$ is synonymous with $Al_xO_y$ (where x and y are positive real numbers).

In addition, it is assumed that suffixes "x," "v," "y" and the like representing compositions can take independent values between and among different compounds.

In one embodiment of the semiconductor light-emitting device, the sub reflecting part of the first light-reflecting layer is formed of any one kind of multilayer film selected from among a multilayer film in which $Al_xGa_{1-x}As$ layer and $Al_zGa_{1-z}As$ layer are alternately stacked, a multilayer film in which $(Al_xGa_{1-x})_yIn_{1-y}P$ layer and $(Al_zGa_{1-z})_yIn_{1-y}P$ layer, alternately stacked, a multilayer film in which $(Al_xGa_{1-x})_yIn_{1-y}N$ layer and $(Al_zGa_{1-z})_yIn_{1-y}N$ layer alternately stacked, a multilayer film in which $(Al_xGa_{1-x})_yIn_{1-y}As$ layer and $(Al_zGa_{1-z})_yIn_{1-y}As$ layer are alternately stacked, and a multilayer film in which $(Al_xGa_{1-x})_yIn_{1-y}Sb$ layer and $(Al_zGa_{1-z})_yIn_{1-y}Sb$ layer are alternately stacked (where $0<x<z\leq 1$ and $0<v<1$), and the main reflecting part of the first light-reflecting layer is formed of a multilayer film in which any one kind of semiconductor selected from among $Al_xGa_{1-x}As$, $(Al_xGa_{1-x})_yIn_{1-y}P$, $(Al_xGa_{1-x})_yIn_{1-y}N$, $(Al_xGa_{1-x})_yIn_{1-y}As$, and $(Al_xGa_{1-x})_yIn_{1-y}Sb$ (where $0<x\leq 1$ and $0<v<1$) in correspondence to the multilayer film forming the sub reflecting part, and $AlO_y$ layer (where y is a positive real number) or a space layer, are alternately stacked.

As described in conjunction with the prior art, in order to enhance the light extraction efficiency by obtaining a high reflectance with the light-reflecting layer so that higher brightness and higher output can be achieved, given that the light-reflecting layer is a single layer, there is a need for obtaining a larger difference in refractive index between two layers that define the reflecting surface of the light-reflecting layer. Also, when the light-reflecting layer is formed of a multilayer film, it is necessary to obtain a larger difference in refractive index between a pair of semiconductor films constituting the light-reflecting layer. However, for example, in the case of $(Al_xGa_{1-x})_yIn_{1-y}P$-based LEDs, materials that are free from light absorption and that come into lattice matching with the active layer are limited to $(Al_xGa_{1-x})_yIn_{1-y}P$-based materials or $Al_xGa_{1-x}As$-based materials, which are compound semiconductor materials in either case, where the refractive index can be changed only within a range of 2.9 to 3.5 or so at most.

On the other hand, a principle diagram of the reflection layer of the present invention is shown in FIG. 1. This is a structure in which on a semiconductor substrate "a" are deposited, in this order, an $AlO_y$ oxide layer "b," which is formed by oxidizing AlAs, an $Al_xGa_{1-x}As$ layer, a light-reflecting layer "c," which is formed by alternately stacking a high-refractive-index semiconductor material and a low-refractive-index semiconductor material, and an active layer "d." In contrast to this, the prior art includes no $AlO_y$ oxide layer "b." With the shown arrangement, there can be provided a refractive index difference as large as 0.6 to 1.4 or so between the light-reflecting layer "c" and the $AlO_y$ layer "b." Therefore, the reflectance at the interface between the light-reflecting layer "c" and the $AlO_y$ layer "b" becomes larger, so that a larger reflectance can be obtained as compared with normal light-reflecting layers. For example, as shown in FIG. 2, according to the present invention, a higher reflectance can be obtained as compared with the case where the $AlO_y$ layer is not provided (prior art), and yet the half-value width of the reflection spectrum can be increased (the wavelength range with high reflectance is widened).

Meanwhile, a principle diagram of another reflection layer according to the present invention is shown in FIG. 3. This is a structure in which on a semiconductor substrate "a" are deposited, in this order, a light-reflecting layer "f," which is formed by alternately stacking AlAs layer and $Al_xGa_{1-x}As$ layer and further changing the AlAs layer into an $AlO_y$ layer (where y is a positive real number) "b," and an active layer "d." As compared with the conventional light-reflecting layer in which AlAs layer and $Al_xGa_{1-x}As$ layer are alternately stacked as they are, in contrast to this, there can be provided a refractive index difference as large as 0.6 to 1.4 or so between the $AlO_y$ layer and the $Al_xGa_{1-x}As$ layer. As a result, reflection characteristic of the light-reflecting layer "f" shows a high reflectance of 99% at maximum as shown in FIG. 4, with its wavelength range also widened. Further, since the reflectance abruptly decreases for light of wavelengths falling outside the necessary wavelength range, the semiconductor light-emitting device is enhanced in color purity as another advantage. As in the case of FIG. 1, even with variations or fluctuations in layer thickness, reflectance and reflection spectrum are less liable to variations, hence a high mass productivity.

Al is strong in bond with oxygen, so highly oxidation-prone, and only by leaving it in the air, Al oxide is formed. However, the Al oxide film formed only by natural oxidation as shown above is poor in characteristics, exemplified by large numbers of voids in the film. Accordingly, for example, leaving an $Al_xGa_{1-x}As$ layer (in particular, one having an Al composition of nearly 1) in a water vapor atmosphere at a temperature of 300° C. to 400° C. allows Al to be oxidized by high-temperature water vapor, so that stabler $AlO_y$ layer can be formed (e.g., Specification of U.S. Pat. No. 5,517,039, or Kenichi Iga et al., "Fundamentals and Applications of Plane Emission Laser," Kyoritsu Shuppan K. K., June 1999, pp. 105-113.) This $AlO_y$ layer, because of being an oxide (dielectric), is much lower in refractive index "n" than semiconductor materials, taking a value of n=2.5 to 1.9. Accordingly, by changing the $Al_xGa_{1-x}As$ layer into an $AlO_y$ layer so that the refractive index is lowered, the reflectance for the light emitted by the active layer can be enhanced. Thus, a high reflectance can be obtained even with a small number of pairs in the light-reflecting layer, and the light emitted from the active layer can be extracted outside effectively.

Also, the $AlO_y$ layer, because of being an oxide (dielectric), is large in band gap, and transparent to blue to red visible light regions. Therefore, according to the present invention, a high-quality light-reflecting layer which is very small in wavelength dependence and which is close to 100% in reflectance can be formed. As a result of this, it is no longer necessary to laboriously select an Al composition which is free from absorption to emission wavelength, as would be involved in the light-reflecting layer made of semiconductor materials of the prior art.

According to the present invention, a high reflectance can be obtained as compared with the case where the $AlO_y$ layer is not provided (prior art), and yet the half-value width of the reflection spectrum can be increased. As a result, even with variations or fluctuations in layer thickness of the light-reflecting layer, reflectance and reflection spectrum are less liable to variations, hence a high mass productivity.

Since the low-refractive-index Al rich layer "$f_2$" constituting the light-reflecting layer becomes an $AlO_y$ layer having an even lower refractive index, the reflectance for the light emitted by the active layer can be enhanced. Thus, a high reflectance can be obtained even with a small number of pairs of the light-reflecting layer, and the light emitted from the active layer can be extracted outside effectively. For example, as shown in FIG. 4, according to the present invention, a higher reflectance can be obtained as compared with the case where the $AlO_y$ layer is not changed into an $AlO_y$ layer (prior art), and yet the half-value width of the reflection spectrum can be increased. As a result, even with variations or fluctuations in layer thickness of the light-reflecting layer, reflectance and reflection spectrum are less liable to variations, hence a high mass productivity.

FIG. 5 shows a pair-number dependence of the reflectance of the light-reflecting layer according to the present invention, in comparison with prior arts. In the figure, a solid line α connecting marks "•" to one another shows a characteristic with the use of a pair of a low-refractive-index $AlO_y$ layer and a high-refractive-index $Al_{0.60}Ga_{0.40}As$ layer according to the present invention, while the other lines β1, β2, β3, β4 and β5 show characteristics with the use of known pairs. More specifically, β1 shows a characteristic with the use of a pair of $Al_{0.75}Ga_{0.25}As$ layer and AlAs layer, β2 shows a characteristic with the use of a pair of $Al_{0.70}Ga_{0.30}As$ layer and AlAs layer, β3 shows a characteristic with the use of a pair of $Al_{0.60}Ga_{0.40}As$ layer and AlAs layer, β4 shows a characteristic with the use of a pair of $(Al_{0.40}Ga_{0.60})_{0.51}In_{0.49}P$ layer and $Al_{0.51}In_{0.49}P$ layer, and β5 shows a characteristic with the use of a pair of $(Al_{0.50}Ga_{0.50})_{0.51}In_{0.49}P$ layer and $Al_{0.51}In_{0.49}P$ layer. As can be understood from the figure, according to the present invention, the light-reflecting layer, by virtue of its large refractive index difference, can achieve a reflectance of almost 100% even with a few pairs of the light-reflecting layer. Thus, the growth time can be reduced and a high mass productivity can be obtained.

The method for manufacturing a semiconductor light-emitting device of the present invention has the following constitution. That is, the method for manufacturing a semiconductor light-emitting device of the present invention is one of stacking, on a semiconductor substrate, a plurality of layers including an active layer made of a semiconductor which generates light of a specified wavelength. Furthermore, the method comprising the steps of:

providing, between the semiconductor substrate and the active layer, an Al rich layer higher in Al ratio than any other layer among the plurality of layers;

dividing into chips a wafer in which the plurality of layers are stacked, thereby making a side face of the Al rich layer exposed; and oxidizing Al contained in the Al rich layer from the exposed side face, thereby making a peripheral portion of the Al rich layer changed into an $AlO_y$ layer.

In the semiconductor light-emitting device manufacturing method of this invention, peripheral portion of the Al rich layer is changed into an $AlO_y$ layer (dielectric) so that the refractive index is lowered, by which the reflectance for the light emitted by the active layer can be enhanced. Thus, the light emitted from the active layer can be extracted outside effectively.

In one embodiment of the method for manufacturing a semiconductor light-emitting device, the step of oxidizing Al contained in the Al rich layer is carried out by leaving in a water vapor the chips in which the side face of the Al rich layer is exposed.

In one embodiment of the method for manufacturing a semiconductor light-emitting device, the water vapor is introduced to the side face of the Al rich layer by an inert gas that has been passed through boiling water.

In one embodiment of the method for manufacturing a semiconductor light-emitting device, the step of oxidizing Al contained in the Al rich layer is carried out in an atmosphere having a temperature of 300° C. to 400° C.

In one embodiment, the method for manufacturing a semiconductor light-emitting device further comprises the step of removing, by etching, the $AlO_y$ layer formed at the peripheral portion of the Al rich layer.

In the semiconductor light-emitting device manufacturing method of this one embodiment, since the space region formed by the removal of the $AlO_y$ layer has a refractive index of 1, a nearly total reflection state can be obtained at the chip peripheral portion of the rear side of the active layer. Thus, the light emitted from the active layer can be extracted outside effectively.

Also, according to the present invention, there is provided an LED lamp which comprises the semiconductor light-emitting device as defined above.

In one embodiment of the LED lamp, as said semiconductor light-emitting device, a plurality of semiconductor light-emitting devices having different wavelengths from each other are integrally provided, and the semiconductor light-emitting devices are connected in the manner that they can be applied with electric current independently from each other.

Also, according to the present invention, there is provided an LED display in which the LED lamp as defined above is arrayed in a matrix.

In one embodiment, there is provided a method for manufacturing a semiconductor light-emitting device, including the step of forming an electrode for electrical conduction at a region above the active layer corresponding to a remaining portion of the Al rich layer that is not changed into the $AlO_y$ layer.

In the semiconductor light-emitting device manufacturing method of this one embodiment, an electrode is formed at a region above the active layer corresponding to a remaining portion of the Al rich layer that is not changed into the $AlO_y$ layer. Therefore, out of the Al rich layer, the region corresponding to the portion that has been changed into the $AlO_y$ layer can be prevented from being occupied by the electrode. Thus, the light generated by the active layer and reflected by the $AlO_y$ layer can be extracted outside effectively without being interrupted by the electrode.

In one embodiment, there is provided a method for manufacturing a semiconductor light-emitting device, including the step of forming a current blocking layer for blocking electric current at a region corresponding to a remaining portion of the Al rich layer that is not changed into the $AlO_y$ layer.

In the semiconductor light-emitting device manufacturing method of this one embodiment, a current blocking layer for blocking electric current is formed at a region corresponding to its remaining portion that is not changed into the $AlO_y$ layer. Therefore, a larger amount of electric current flows through the region corresponding to the $AlO_y$ layer, as compared with the case where the current blocking layer is not formed. Thus, the light generated by the active layer and reflected by the $AlO_y$ layer can be extracted outside effectively.

In one embodiment, there is provided a method for manufacturing a semiconductor light-emitting device, wherein the light-reflecting layer is formed by alternately stacking a layer containing Al and having a specified Al composition and an $AlO_y$ layer, and thickness of one layer which is among the layers forming the light-reflecting layer and which is adjacent to the layer containing Al and changed into the $AlO_y$ layer is set to a quarter of the wavelength.

In one embodiment, there is provided a method for manufacturing a semiconductor light-emitting device, further including the step of, after dividing the layers into chips, making the Al rich layer changed into the $AlO_y$ layer from its exposed end face, where a remaining portion of the Al rich layer that is not changed into the $AlO_y$ layer is made coincident in configuration with the electrode above the active layer.

In the semiconductor light-emitting device manufacturing method of this one embodiment, it is no longer necessary to laboriously select an Al composition which is free from absorption to emission wavelength, as would be involved in the light-reflecting layer made of semiconductor materials of the prior art.

In another aspect of the semiconductor light-emitting device of this invention, there is provided a semiconductor light-emitting device having on a semiconductor substrate a light-emitting layer which generates light of a specified wavelength, the semiconductor light-emitting device further including, between the semiconductor substrate and the light-emitting layer, a semiconductor layer which has a refractive index varying with respect to a layer direction so as to reflect light emitted by the light-emitting layer.

It is noted here that the terms, "layer direction," refer to a direction extending along the layer, i.e., a direction (planar direction) along which the layer spreads.

In the semiconductor light-emitting device of this invention, between the semiconductor substrate and the light-emitting layer, is provided a semiconductor layer which has a refractive index varying with respect to a layer direction so as to reflect light emitted by the light-emitting layer. The refractive index of this semiconductor layer is so set as to be lower in a necessary region, for example, a region where the electrode is absent above the light-emitting layer, by which the reflectance for the light emitted by the light-emitting layer can be enhanced. Thus, a high reflectance can be obtained even with a small number of pairs in the light-reflecting layer, and the light emitted from the light-emitting layer can be extracted outside effectively.

As already described, in order to enhance the light extraction efficiency by obtaining a high reflectance with the light-reflecting layer so that higher brightness and higher output can be achieved, there is a need for obtaining a larger difference in refractive index between a pair of semiconductor films constituting the light-reflecting layer. However, for example, in the case of $(Al_xGa_{1-x})_yIn_{1-y}P$-based LEDs, materials that are free from light absorption and that come into lattice matching with the light-emitting layer are limited to $(Al_xGa_{1-x})_yIn_{1-y}P$-based materials or $Al_xGa_{1-x}As$-based materials, which are compound semiconductor materials in either case, where the refractive index can be changed only within a range of 2.9 to 3.5 or so at most.

Accordingly, as a method for manufacturing a semiconductor light-emitting device in the present invention, there is provided a semiconductor light-emitting device manufacturing method including a step of providing on a semiconductor substrate a light-emitting layer which generates light of a specified wavelength, the method further comprising the steps of depositing an $Al_xGa_{1-x}As$ layer and the light-emitting layer on the semiconductor substrate in this order, and making part of the $Al_xGa_{1-x}As$ layer in the layer direction changed into an $AlO_y$ layer (where y is a positive real number).

Al in the $Al_xGa_{1-x}As$ layer is strong in bond with oxygen, so highly oxidation-prone, and when it is left in the air, Al oxide is formed. Accordingly, oxidizing an $Al_xGa_{1-x}As$ layer (in particular, one having an Al composition "x" of nearly 1) in a water vapor at a temperature of 300° C. to 400° C. allows a stable $AlO_y$ layer to be formed. This $AlO_y$ layer, because of being an oxide containing Al, is much lower in refractive index "n" than semiconductor materials, taking a value of n=2.5 to 1.9. Accordingly, by changing the $Al_xGa_{1-x}As$ layer into an $AlO_y$ layer so that the refractive index is lowered, the reflectance for the light emitted by the light-emitting layer can be enhanced. Thus, a high reflectance can be obtained even with a small number of pairs in the light-reflecting layer, and the light emitted from the light-emitting layer can be extracted outside effectively.

Also, the $AlO_y$ layer, because of being an oxide, is large in band gap, and transparent to visible light regions, particularly a region of 560 nm to 650 nm, which is the emission region of $(Al_xGa_{1-x})_yIn_{1-y}P$-based materials. Therefore, according to the present invention, a high-quality light-reflecting layer which is very small in wavelength dependence and which is close to 100% in reflectance can be formed. As a result of this, it is no longer necessary to laboriously select an Al composition which is free from absorption to emission wavelength, as would be involved in the light-reflecting layer made of semiconductor materials of the prior art.

In a method for manufacturing a semiconductor light-emitting device in one embodiment, as illustrated in FIG. 1, an $Al_xGa_{1-x}As$ layer, a light-reflecting layer "c" in which a high-refractive-index material and a low-refractive-index material are alternately stacked, and a light-emitting layer "d" are deposited in this order on a semiconductor substrate "a," and then part of the $Al_xGa_{1-x}As$ layer in the layer direction is changed into an $AlO_y$ layer "b" (FIG. 1, however, shows only a region that has been changed into the $AlO_y$ layer). With such an arrangement, a refractive index difference as large as 0.6 to 1.4 or so can be provided between the light-reflecting layer "c" and the $AlO_y$ layer "b." Therefore, the reflectance at the interface between the light-reflecting layer "c" and the AlO$_y$ layer "b" becomes larger, so that a larger reflectance can be obtained as compared with normal light-reflecting layers. For example, as shown in FIG. 2, according to the present invention, a higher reflectance can be obtained as compared with the case where the AlO$_y$ layer is not provided (prior art), and yet the half-value width of the reflection spectrum can be increased. As a result, even with variations or fluctuations in layer thickness of the light-reflecting layer, reflectance and reflection spectrum are less liable to variations, hence a high mass productivity.

In a method for manufacturing a semiconductor light-emitting device in one embodiment, as illustrated in FIG. 3, a light-reflecting layer "f" in which a high-refractive-index semiconductor material "f$_1$" and a low-refractive-index Al$_x$Ga$_{1-x}$As layer "f$_2$" (where 0<x≦1) are alternately stacked, and a light-emitting layer "d" are deposited in this order on a semiconductor substrate "a," and then part of the Al$_x$Ga$_{1-x}$As layer "f$_2$" in the layer direction is changed into an AlO$_y$ layer (FIG. 3, however, shows only a region (dotted) that has been changed into the AlO$_y$ layer). With such an arrangement, the low-refractive-index Al$_x$Ga$_{1-x}$As layer "f$_2$" constituting the light-reflecting layer becomes an AlO$_y$ layer having an even lower refractive index, so that the reflectance for the light emitted by the light-emitting layer can be enhanced. Thus, a high reflectance can be obtained even with a small number of pairs in the light-reflecting layer, and the light emitted from the light-emitting layer can be extracted outside effectively. For example, as shown in FIG. 4, according to the present invention, a higher reflectance can be obtained as compared with the case where the Al$_x$Ga$_{1-x}$As layer is not changed into the AlO$_y$ layer (prior art), and yet the half-value width of the reflection spectrum can be increased. As a result, even with variations or fluctuations in layer thickness of the light-reflecting layer, reflectance and reflection spectrum are less liable to variations, hence a high mass productivity.

FIG. 5 shows a pair-number dependence of the reflectance of the light-reflecting layer according to the present invention, in comparison with prior arts. According to the present invention, the light-reflecting layer, by virtue of its large refractive index difference, can achieve a reflectance of almost 100% even with a few pairs of the light-reflecting layer. Thus, the growth time can be reduced and a high mass productivity can be obtained.

In one embodiment, there is provided a method for manufacturing a semiconductor light-emitting device, including the steps of making part of the Al$_x$Ga$_{1-x}$As layer in the layer direction changed into an AlO$_y$ layer, and thereafter removing the AlO$_y$ layer.

In the semiconductor light-emitting device manufacturing method of this one embodiment, since the space region formed by the removal of the AlO$_y$ layer has a refractive index of 1, a nearly total reflection state can be obtained at the chip peripheral portion on the rear side of the light-emitting layer. Thus, the light emitted from the light-emitting layer can be extracted outside effectively.

In one embodiment, there is provided a method for manufacturing a semiconductor light-emitting device, including the step of forming an electrode for electrical conduction at a region above the light-emitting layer corresponding to a remaining portion of the Al$_x$Ga$_{1-x}$As layer that is not changed into the AlO$_y$ layer.

In the semiconductor light-emitting device manufacturing method of this one embodiment, an electrode is formed at a region above the light-emitting layer corresponding to a remaining portion of the Al$_x$Ga$_{1-x}$As layer that is not changed into the AlO$_y$ layer. Therefore, out of the Al$_x$Ga$_{1-x}$As layer, the region corresponding to the portion that has been changed into the AlO$_y$ layer can be prevented from being occupied by the electrode. Thus, the light generated by the light-emitting layer and reflected by the AlO$_y$ layer can be extracted outside effectively without being interrupted by the electrode.

In one embodiment, there is provided a method for manufacturing a semiconductor light-emitting device, comprising the steps of forming a current blocking layer for blocking electric current at a region above the light-emitting layer corresponding to a remaining portion of the Al$_x$Ga$_{1-x}$As layer that is not changed into the AlO$_y$ layer.

In the semiconductor light-emitting device manufacturing method of this one embodiment, a current blocking layer for blocking electric current is formed at a region above the light-emitting layer corresponding to a remaining portion of the Al$_x$Ga$_{1-x}$As layer that is not changed into the AlO$_y$ layer. Therefore, a larger amount of electric current flows through the region corresponding to the AlO$_y$ layer, as compared with the case where the current blocking layer is not formed. Thus, the light generated by the light-emitting layer and reflected by the AlO$_y$ layer can be extracted outside effectively.

In one embodiment, there is provided a method for manufacturing a semiconductor light-emitting device, including the steps of forming the light-reflecting layer by alternately stacking an Al$_x$Ga$_{1-x}$As layer having a specified Al composition (where 0<x≦1) and an AlO$_y$ layer, wherein thickness of one layer which is among the Al$_x$Ga$_{1-x}$As layers forming the light-reflecting layer and which is adjacent to the Al$_x$Ga$_{1-x}$As layer changed into the AlO$_y$ layer is set to a quarter of the wavelength.

In the semiconductor light-emitting device manufacturing method of this one embodiment, the reflectance for the light emitted by the light-emitting layer is further enhanced at the region corresponding to the AlO$_y$ layer.

In one embodiment, there is provided a method for manufacturing a semiconductor light-emitting device, including the step of forming the light-emitting layer from an (Al$_x$Ga$_{1-x}$)$_y$In$_{1-y}$P-based material.

In the semiconductor light-emitting device manufacturing method of this one embodiment, a semiconductor light-emitting device having an emission wavelength band of 560 nm to 650 nm is fabricated.

In one embodiment, there is provided a method for manufacturing a semiconductor light-emitting device, further including the step of, after dividing the layers into chips, making the Al$_x$Ga$_{1-x}$As layer changed into the AlO$_y$ layer from its exposed end face, where a remaining portion of the Al$_x$Ga$_{1-x}$As layer that is not changed into the AlO$_y$ layer is made coincident in configuration with the electrode above the light-emitting layer.

In the semiconductor light-emitting device manufacturing method of this one embodiment, since the Al$_x$Ga$_{1-x}$As layer is changed into the AlO$_y$ layer from its exposed end face, the AlO$_y$ layer can be formed stably and easily, hence a high mass productivity. Still, since the remaining portion of the Al$_x$Ga$_{1-x}$As layer that is not changed into the AlO$_y$ layer is made coincident in configuration with the electrode on the light-emitting layer, the region out of the Al$_x$Ga$_{1-x}$As layer corresponding to the portion that has been changed into the AlO$_y$ layer can be prevented from being occupied by the electrode. Thus, the light generated by the light-emitting layer and reflected by the AlO$_y$ layer can be extracted outside effectively without being interrupted by the electrode.

In one embodiment, there is provided a method for manufacturing a semiconductor light-emitting device, further including the step of, after dividing the layers into chips, making the $Al_xGa_{1-x}As$ layer changed into the $AlO_y$ layer from its exposed end face, where a remaining portion of the $Al_xGa_{1-x}As$ layer that is not changed into the $AlO_y$ layer is made coincident in configuration with the current blocking layer.

In the semiconductor light-emitting device manufacturing method of this one embodiment, since the $Al_xGa_{1-x}As$ layer is changed into the $AlO_y$ layer from its exposed end face, the $AlO_y$ layer can be formed stably and easily, hence a high mass productivity. Still, since the remaining portion of the $Al_xGa_{1-x}As$ layer that is not changed into the $AlO_y$ layer is made coincident in configuration with the current blocking layer, a large amount of electric current flows through the region corresponding to the $AlO_y$ layer. Thus, the light generated by the light-emitting layer and reflected by the $AlO_y$ layer can be extracted outside effectively.

In one embodiment, there is provided a method for manufacturing a semiconductor light-emitting device, wherein an $Al_xGa_{1-x}P$ layer, an $Al_xIn_{1-x}P$ layer or an $Al_xIn_{1-x}As$ layer is used in place of the $Al_xGa_{1-x}As$ layer.

Also, as a method for manufacturing a semiconductor light-emitting device according to the present invention, there is provided a semiconductor light-emitting device manufacturing method including the step of providing above a semiconductor substrate a light-emitting layer which generates light of a specified wavelength. The method further includes the steps of: depositing on the semiconductor substrate, in an order given below, a light-reflecting layer in which an $Al_xGa_{1-x}As$ layer (where $0<x\leq1$) having a specified Al composition and an $(Al_xGa_{1-x})_vIn_{1-v}P$ layer (where $0<x\leq1$ and $0<v<1$) are alternately stacked and which serves for reflecting the light of the wavelength, and the light-emitting layer; and making part of the $Al_xGa_{1-x}As$ layer in the layer direction changed into an $AlO_y$ layer (where y is a positive real number).

In the semiconductor light-emitting device manufacturing method of this invention, by changing the $Al_xGa_{1-x}As$ layer into an $AlO_y$ layer so that the refractive index is lowered, the reflectance for the light emitted by the light-emitting layer can be enhanced. Thus, a high reflectance can be obtained even with a small number of pairs in the light-reflecting layer, and the light emitted from the light-emitting layer can be extracted outside effectively.

Also, the $AlO_y$ layer, because of being an oxide, is large in band gap, and transparent to visible light regions, particularly a region of 560 nm to 670 nm, which is the emission region of $(Al_xGa_{1-x})_vIn_{1-v}P$-based materials. Therefore, according to the present invention, a high-quality light-reflecting layer which is very small in wavelength dependence and which is close to 100% in reflectance can be formed. As a result of this, it is no longer necessary to laboriously select an Al composition which is free from absorption to emission wavelength, as would be involved in the light-reflecting layer made of semiconductor materials of the prior art.

In one embodiment, there is provided a method for manufacturing a semiconductor light-emitting device, further including the step of, after the step of making part of the $Al_xGa_{1-x}As$ layer in the layer direction changed into an $AlO_y$ layer, removing the $AlO_y$ layer by using a hydrofluoric acid-based etching solution.

In the semiconductor light-emitting device manufacturing method of this one embodiment, only the $AlO_y$ layer can be selectively etched and thereby removed out of $Al_xGa_{1-x}As$ layer or the like.

DETAILED DESCRIPTION OF THE PREFERRED EMBODIMENTS

Hereinbelow, the present invention is described in detail by way of embodiments thereof illustrated in the accompanying drawings.

First Embodiment

Figure 1:
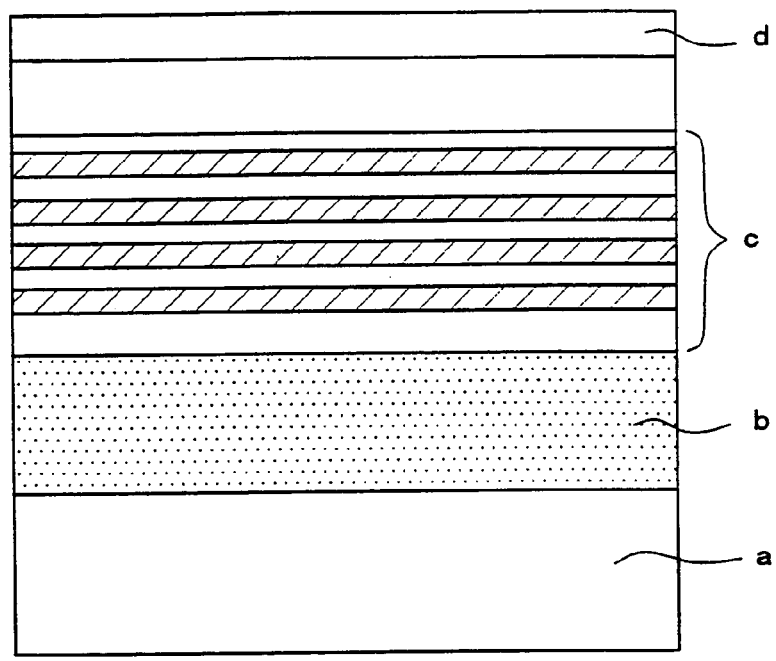
FIG. 1 is a view for explaining a first principle of the present invention.
Figure 2:
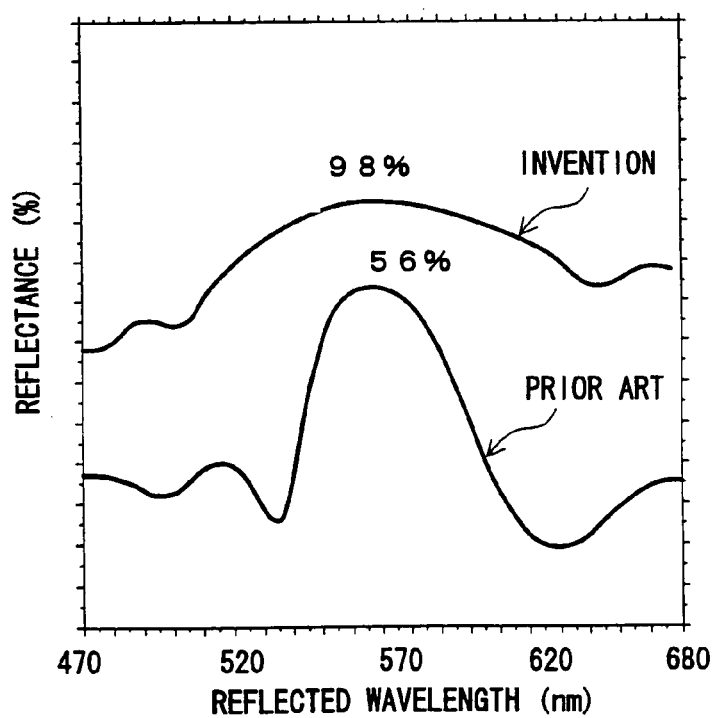
FIG. 2 is a chart showing a reflection spectrum of the light-reflecting layer by the first principle.
Figure 3:
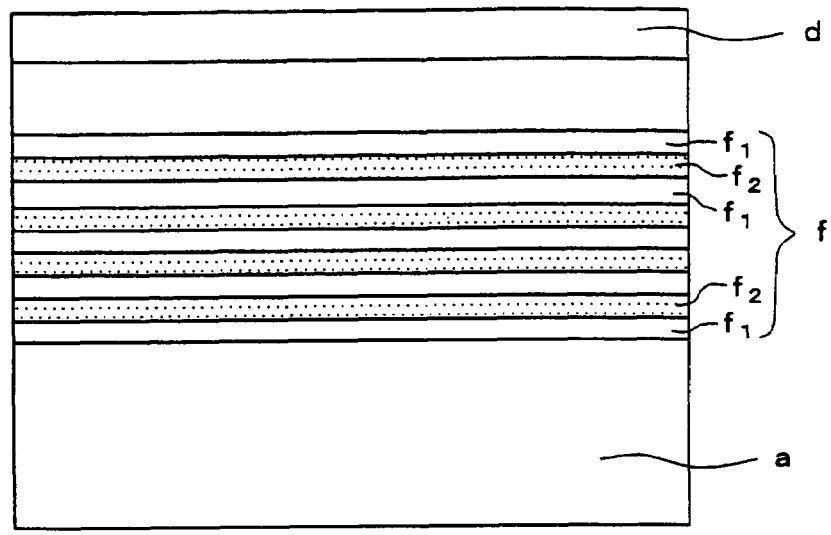
FIG. 3 is a view for explaining a second principle of the present invention.
Figure 4:
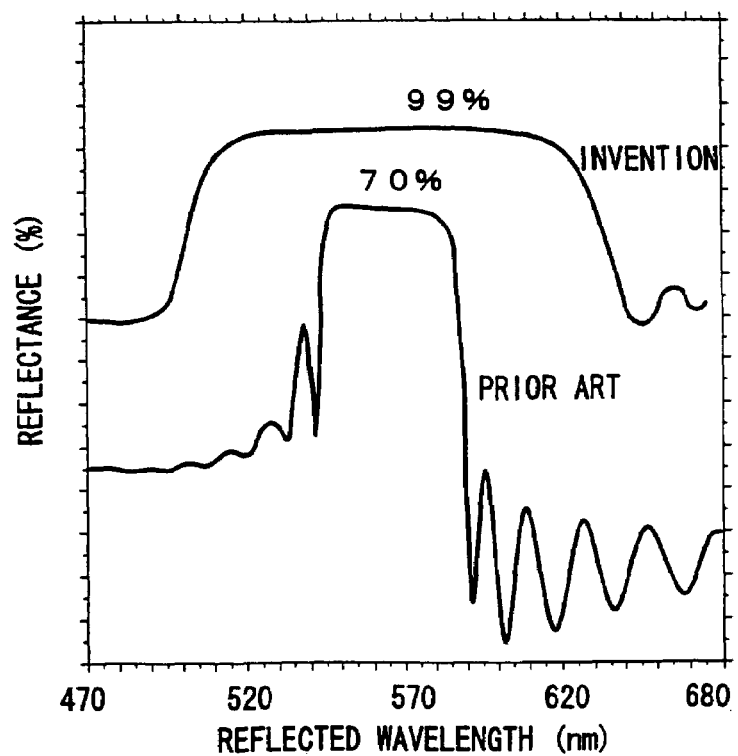
FIG. 4 is a chart showing a reflection spectrum of the light-reflecting layer by the second principle.
Figure 5:
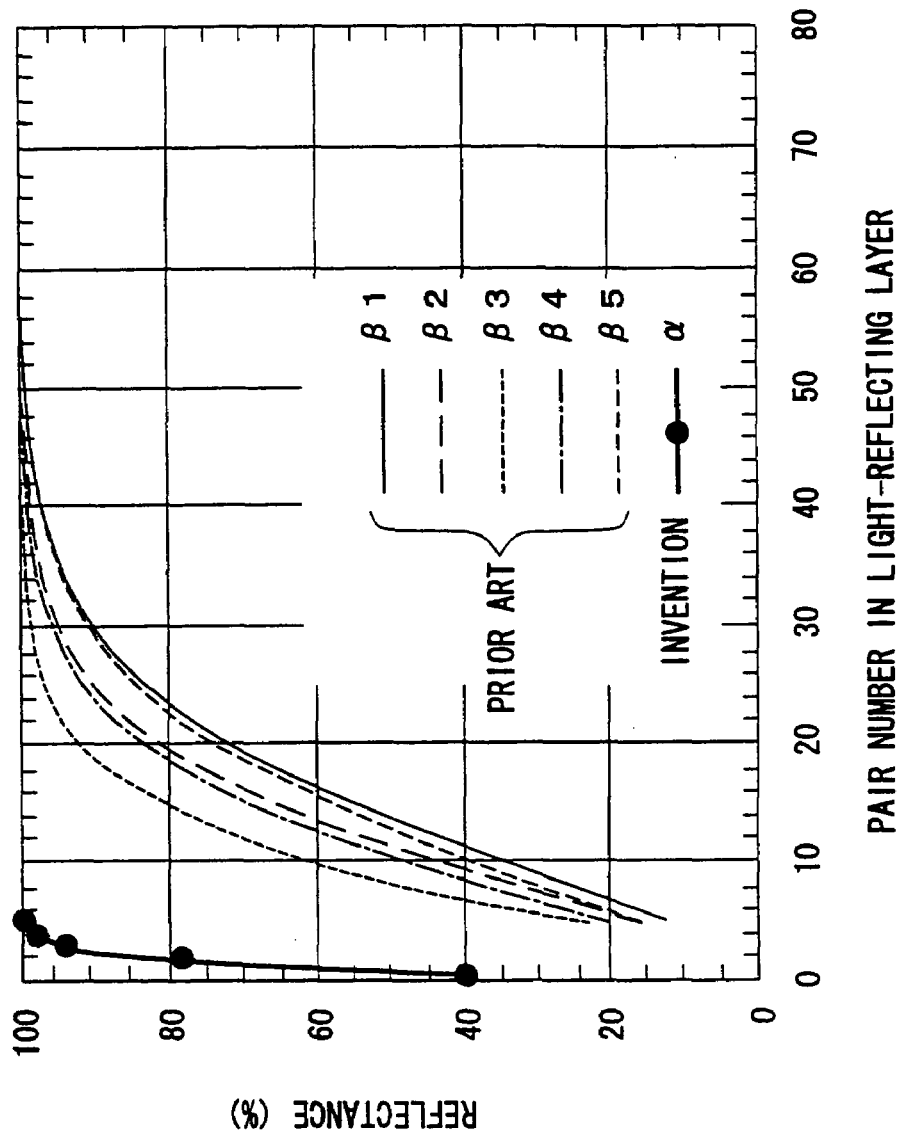
FIG. 5 is a chart showing pair-number dependence of the reflectance of the light-reflecting layer according to the present invention.
Figure 6:
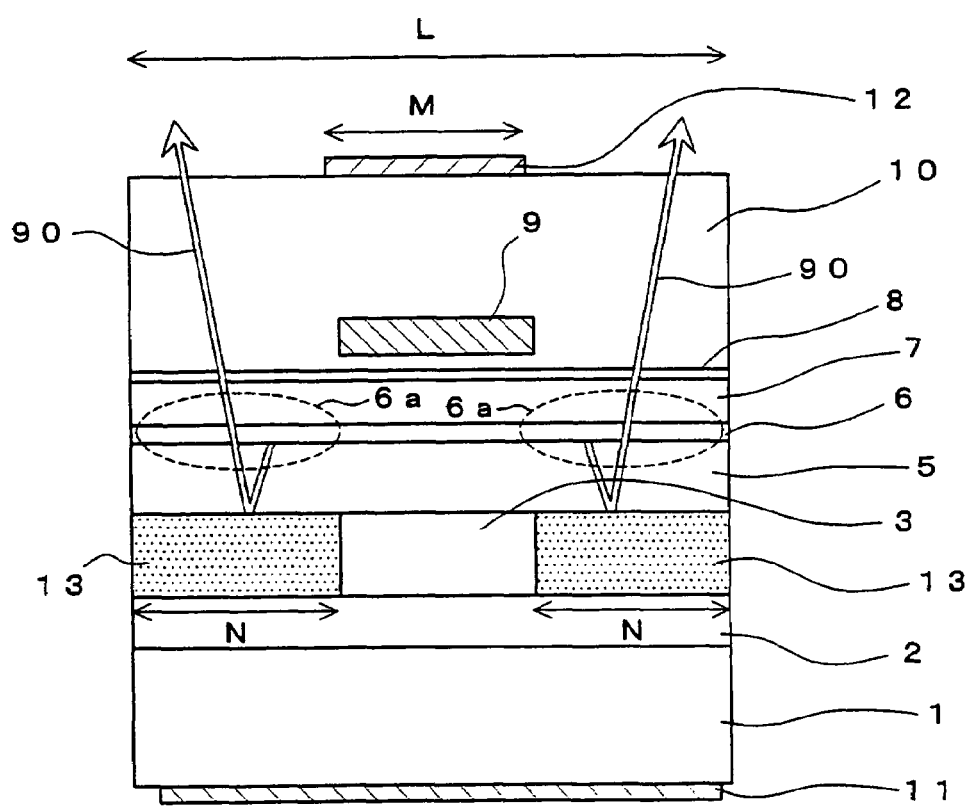
FIG. 6 is a sectional view showing the constitution of an LED according to a first embodiment of the invention.

FIG. 6 shows a cross-sectional structure of a semiconductor LED according to a first embodiment. This embodiment is characterized in that main reflecting part of a first light-reflecting layer is given by an $AlO_y$ single layer (where y is a positive real number).

This LED includes, on an n-type GaAs substrate 1, an n-type GaAs buffer layer (e.g., thickness: 0.5 μm; dopant concentration: $5\times10^{17}$ cm$^{-3}$) 2, an n-type AlAs conductive layer 3 as a sub reflecting part and an $AlO_y$ oxide layer 13 as a main reflecting part, which adjoin along the layer direction as a first light-reflecting layer. The n-type AlAs conductive layer 3 as the sub reflecting part is disposed at a center region of the chip, and the $AlO_y$ oxide layer 13 as the main reflecting part is disposed at a peripheral region of the chip so as to surround the conductive layer 3. This LED further includes thereon an $(Al_xGa_{1-x})_{0.51}In_{0.49}P$ lower cladding layer ($0\leq x\leq1$, e.g. x=1.0; thickness: 1.0 μm; dopant concentration: $5\times10^{17}$ cm$^{-3}$) 5, a p-type $(Al_xGa_{1-x})_vIn_{1-v}P$ active layer ($0\leq x\leq1$, e.g. x=0.42; thickness: 0.6 μm; dopant concentration: $1\times10^{17}$ cm$^{-3}$) 6; a p-type $(Al_xGa_{1-x})_{0.51}In_{0.49}P$ upper cladding layer ($0\leq x\leq1$, e.g. x=1.0;

thickness: 1.0 μm; dopant concentration: 5×10$^{17}$ cm$^{-3}$) 7, and a p-type (Al$_x$Ga$_{1-x}$)$_v$In$_{1-v}$P intermediate layer (x=0.2; v=0.4; thickness: 0.15 μm; dopant concentration: 1×10$^{18}$ cm$^{-3}$) 8, in this order. This LED includes further thereon a p-type (Al$_x$Ga$_{1-x}$)$_v$In$_{1-v}$P current spreading layer (x=0.05; v=0.05; total thickness: 8.5 μm; dopant concentration: 5×10$^{18}$ cm$^{-3}$) 10, and an n-type GaP current blocking layer (thickness: 0.3 μm; dopant concentration: 1×10$^{18}$ cm$^{-3}$) 9 which is formed at a central region in this current spreading layer and which serves to block electric current. Reference numeral 11 denotes an n-side electrode, and 12 denotes a p-side electrode.

This LED is fabricated by the following process:

(i) All over an n-type GaAs substrate 1, are deposited, in an order given below, an n-type GaAs buffer layer (e.g., thickness: 0.5 μm; dopant concentration: 5×10$^{17}$ cm$^{-3}$) 2, an n-type AlAs conductive layer 3 as an Al rich layer, an (Al$_x$Ga$_{1-x}$)$_{0.51}$In$_{0.49}$P lower cladding layer (0≦x≦1, e.g. x=1.0; thickness: 1.0 μm; dopant concentration: 5×10$^{17}$ cm$^{-3}$) 5; a p-type (Al$_x$Ga$_{1-x}$)$_v$In$_{1-v}$P active layer (0≦x≦1, e.g. x=0.42; thickness: 0.6 μm; dopant concentration: 1×10$^{17}$ cm$^{-3}$) 6 as an active layer; a p-type (Al$_x$Ga$_{1-x}$)$_{0.51}$In$_{0.49}$P upper cladding layer (0≦x≦1, e.g. x=1.0; thickness: 1.0 μm; dopant concentration: 5×10$^{17}$ cm$^{-3}$) 7, and a p-type (Al$_x$Ga$_{1-x}$)$_v$In$_{1-v}$P intermediate layer (x=0.2; v=0.4; thickness: 0.15 μm; dopant concentration: 1×10$^{18}$ cm$^{-3}$) 8.

(ii) Next, on the p-type (Al$_x$Ga$_{1-x}$)$_v$In$_{1-v}$P intermediate layer 8, are grown a p-type (Al$_x$Ga$_{1-x}$)$_v$In$_{1-v}$P current spreading layer (x=0.05; v=0.05; thickness: 1.5 μm; dopant concentration: 5×10$^{18}$ cm$^{-3}$) 10, and further thereon an n-type GaP current blocking layer (thickness: 0.3 μm; dopant concentration: 1×10$^{18}$ cm$^{-3}$) 9. Thereafter, the n-type GaP current blocking layer 9 is subjected to selective etching by photolithography process so as to be patterned into an M=100 μm square to 150 μm square, with a current path for applied electric current formed therearound. Subsequently, a p-type (Al$_x$Ga$_{1-x}$)$_v$In$_{1-v}$P current spreading layer (x=0.05; v=0.05; thickness: 7 μm; dopant concentration 5×10$^{18}$ cm$^{-3}$) 10 is regrown.

(iii) Next, a metal layer to serve as an electrode is provided on the p side, and subject to selective etching by photolithography so that the electrode 12 is patterned into an M=100 μm square to 150 μm square in alignment with the position of the current blocking layer 9. Thereafter, the substrate 1 is thinly polished to a thickness of about 120 μm from its rear face side, and an electrode 11 is formed also on the n side (the substrate in this state is called wafer, normally about 50 mm dia. sized). As in the normal breaking method, this wafer, after stuck on its rear face side to an adhesive sheet, is groove-cut halfway of the thickness of the wafer along the pattern of the electrode 12 with a dicing saw, and then spread by pulling up the adhesive sheet. Thus, the wafer is divided into L=280 μm square chips.

(iv) Dividing into chips causes the AlAs layer 3 to be exposed at the chip side faces. In this state, the chips are thrown into oxide forming equipment (not shown) provided in a nitrogen atmosphere at 400° C. Nitrogen gas that has been passed through boiling water is let into the interior of the oxide forming equipment, so that the oxide forming equipment is internally filled with high-temperature steam. When the high-temperature steam is introduced to the side faces at which the AlAs layer 3 is exposed, oxidation progresses at a constant speed from end portions of the chip side faces to their interiors, allowing peripheral portions of the original AlAs layer 3 to be changed into the AlO$_y$ layer 13 (e.g., Specification of U.S. Pat. No. 5,517,039, or Kenichi Iga et al., "Fundamentals and Applications of Plane Emission Laser," Kyoritsu Shuppan K. K., June 1999, pp. 105-113.) A layer-direction size (depth of oxidation) N of this AlO$_y$ layer 13 depends on the temperature, time and material of this oxidation.

The oxidation is further characterized in that better-quality oxide film can be obtained when oxidation is done by steam than merely by oxygen. In particular, bringing steam into a thermostatic oven by nitrogen gas is intended to keep oxygen from entering.

This layer-direction size N is desirably set so as to satisfy the condition:

$$N \leq (L-M)/2,$$

where L is the chip size and M is the length of one side of the current blocking layer or electrode. In this embodiment, the chips are kept in the oxide forming equipment at 400° C. for 3 hours so that the layer-direction size N of the AlO$_y$ layer 13 becomes 80 μm. Whereas the refractive index of the original AlAs layer 3 is 3.1, the refractive index of the AlO$_y$ layer 13 resulting from the oxidation is as low as 1.9. Whereas the reflectance at the substrate is about 30% in the prior art, the reflectance of the light-reflecting layer at peripheral regions of the chips was able to be improved to 80% or more in this embodiment.

Also, when the AlAs layer 3 exposed is oxidized from end portions of the chip side faces so that the peripheral portion of the original AlAs layer 3 is changed into the AlO$_y$ layer 13 as shown above, the AlO$_y$ layer can be formed stably and easily, with high mass-productivity. Still, since the remaining portion of the AlAs layer 3 that is not changed into the AlO$_y$ layer is made coincident in configuration with the current blocking layer 9, a larger amount of electric current flows through the peripheral region of the chip corresponding to the AlO$_y$ layer 13. Therefore, a larger amount of light is generated at a peripheral portion 6a of the active layer 6. Since reflectance of the light-reflecting layer is improved at peripheral regions of the chips, the light generated at the peripheral portion 6a of the active layer 6 is reflected at higher efficiency. More concretely, 80% or more of light 90 reflected from the active layer 6 toward the rear face (substrate) side can be reflected toward the top face side by the AlO$_y$ layer 13. Then, the light reflected toward the top face side is extracted outside effectively without being interrupted by the electrode 12. Actually, in this embodiment, chip luminous intensity at the emission wavelength of 570 nm was able to be improved from normal 35 mcd to 50 mcd. Thus, an improvement in brightness was achieved and an improvement in yield was also obtained.

COMPARATIVE EXAMPLE

Figure 10:
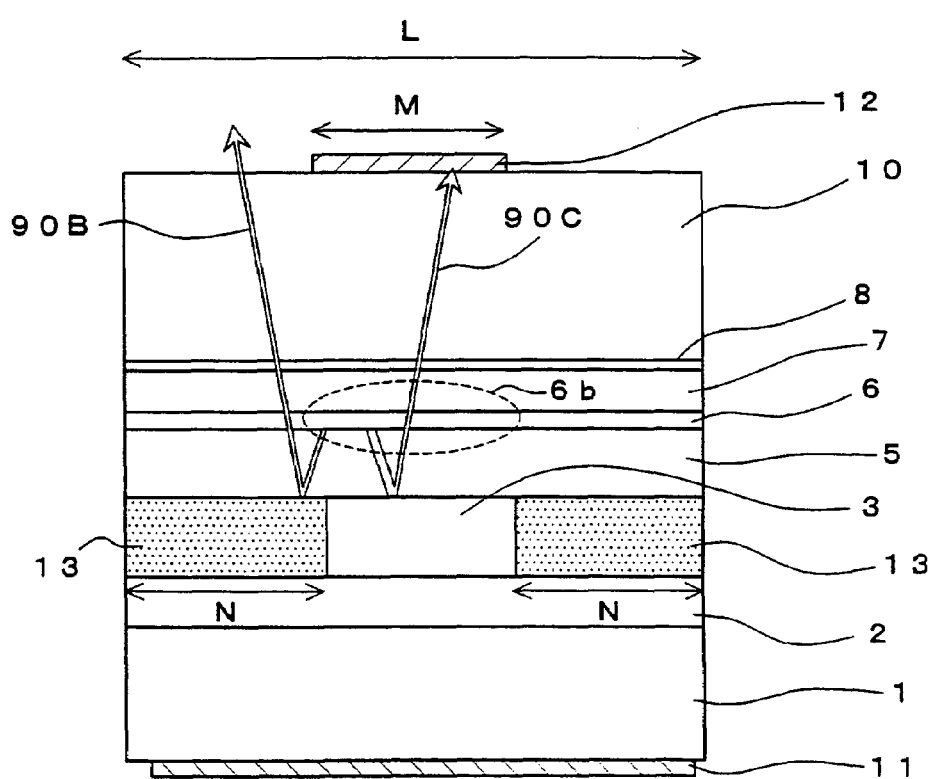
FIG. 10 is a sectional view showing an LED according to a comparative example.
Figure 11:
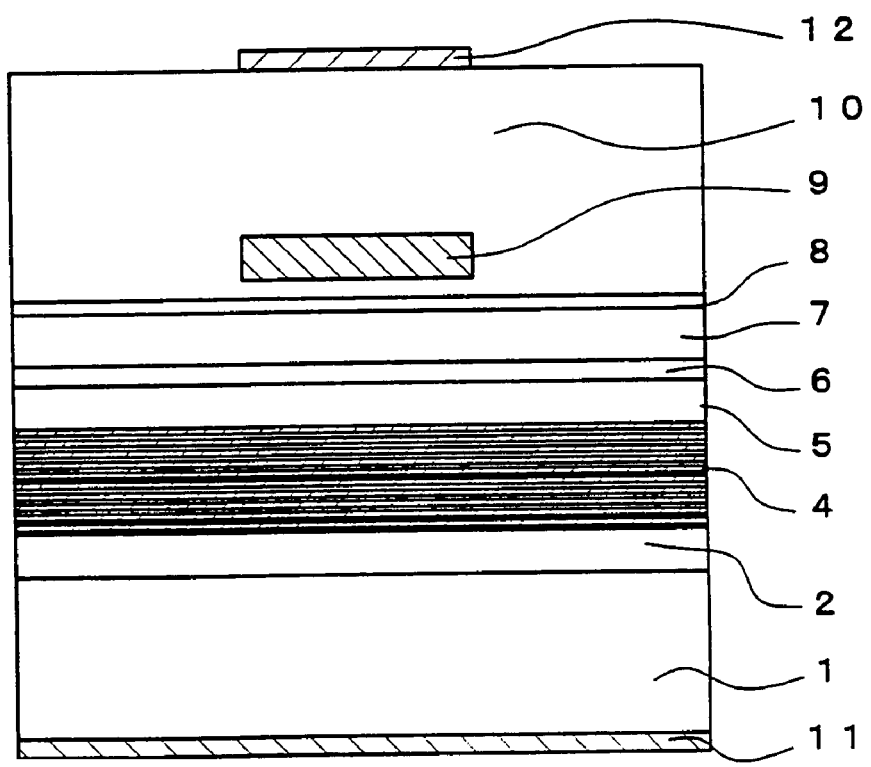
FIG. 11 is a sectional view showing the constitution of an LED according to a prior art.
Figure 12:
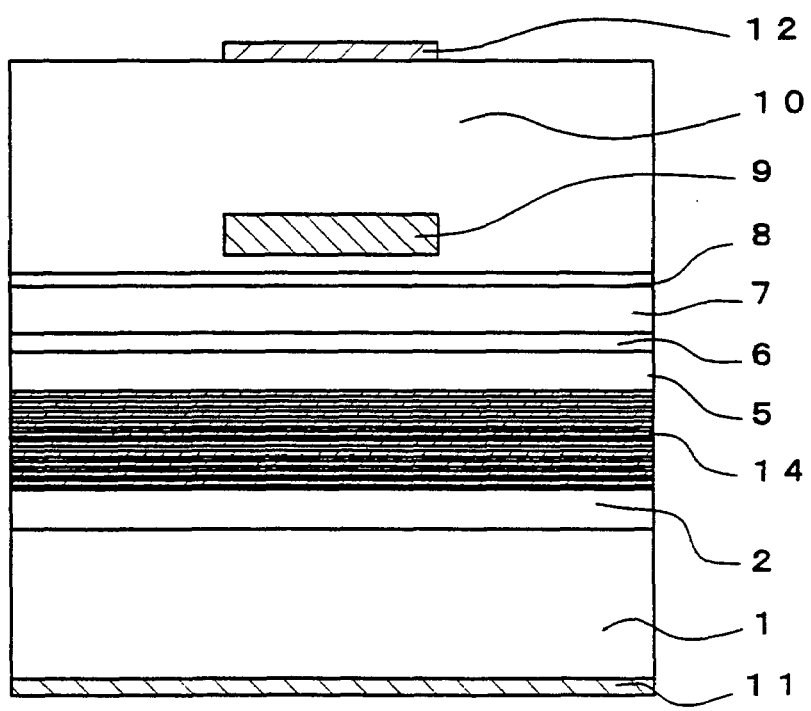
FIG. 12 is a sectional view showing the constitution of an LED according to another prior art.
Figure 13A:
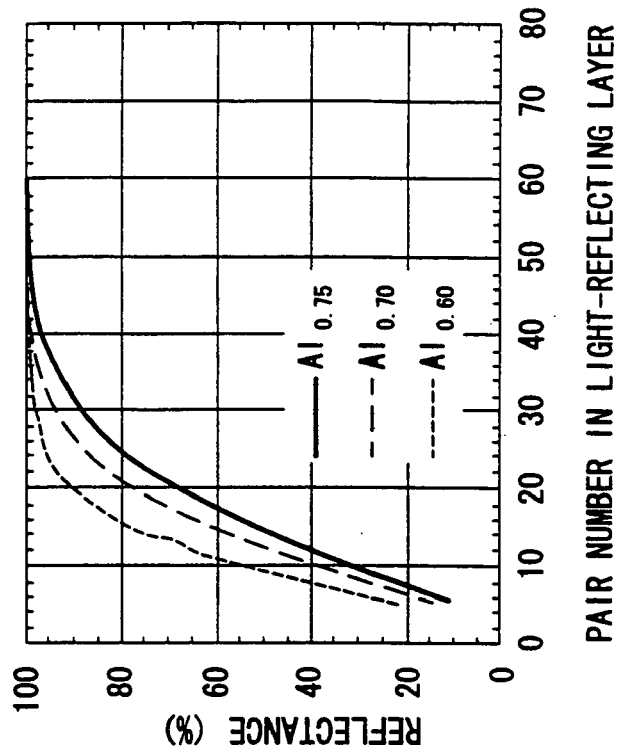
FIGS. 13A and 13B are charts showing pair-number dependences of the reflectance of the light-reflecting layer in an LED of the prior art.
Figure 13B:
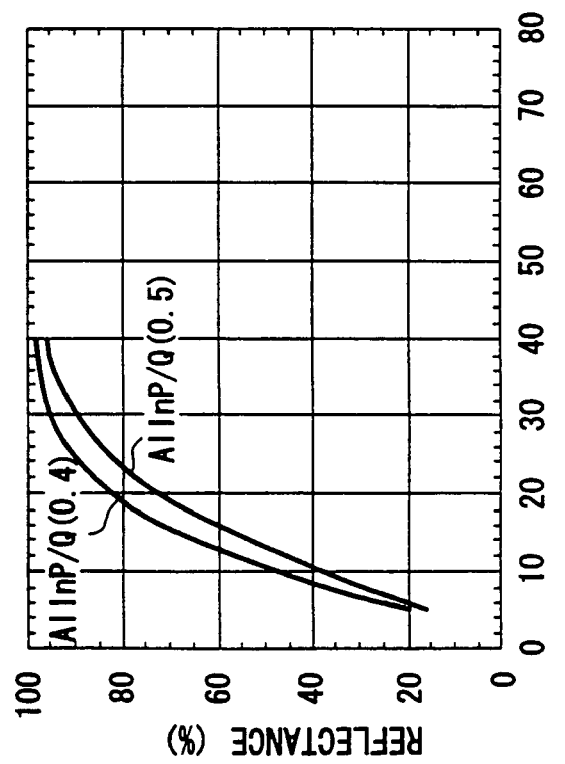

FIG. 10 shows a semiconductor LED having a structure in which the current blocking layer 9 is omitted, as a comparative example. Except that the n-type GaP current blocking layer 9 is omitted, this semiconductor LED is utterly identical in structure to the semiconductor LED of the first embodiment, i.e., absolutely identical in terms of thickness, composition and conductive type of the individual layers.

However, with the semiconductor LED of this comparative example, the brightness-improvement effect was not able to obtain. The reason of this could be considered as follows. That is, in the semiconductor LED of this comparative example, since there is no current blocking layer just under the electrode 12 and since the AlO$_y$ layer 13 is an insulating layer, the emission region is limited to a central portion 6b (a portion just under the electrode 12) of the active layer 6. In this case, out of the light radiated from the central portion 6b of the active layer 6 toward the rear face (substrate) side, a slight portion 90B thereof goes ahead to the peripheral region of the chip so as to be reflected toward the top face side by the $AlO_y$ layer 13, whereas most part 90C thereof becomes incident on the conductive layer 3 just thereunder so as to be absorbed to the substrate without being reflected toward the top face side and, even if reflected toward the top face side, interrupted by the p-type electrode 12 and not extracted to outside. As a result, the emission efficiency cannot be improved, and no improvement in brightness can be obtained. Actually, in this comparative example, the chip luminous intensity at the emission wavelength of 570 nm lowered to 10 mcd, on the contrary, compared with 35 mcd of the conventional structure.

Second Embodiment

Figure 7:
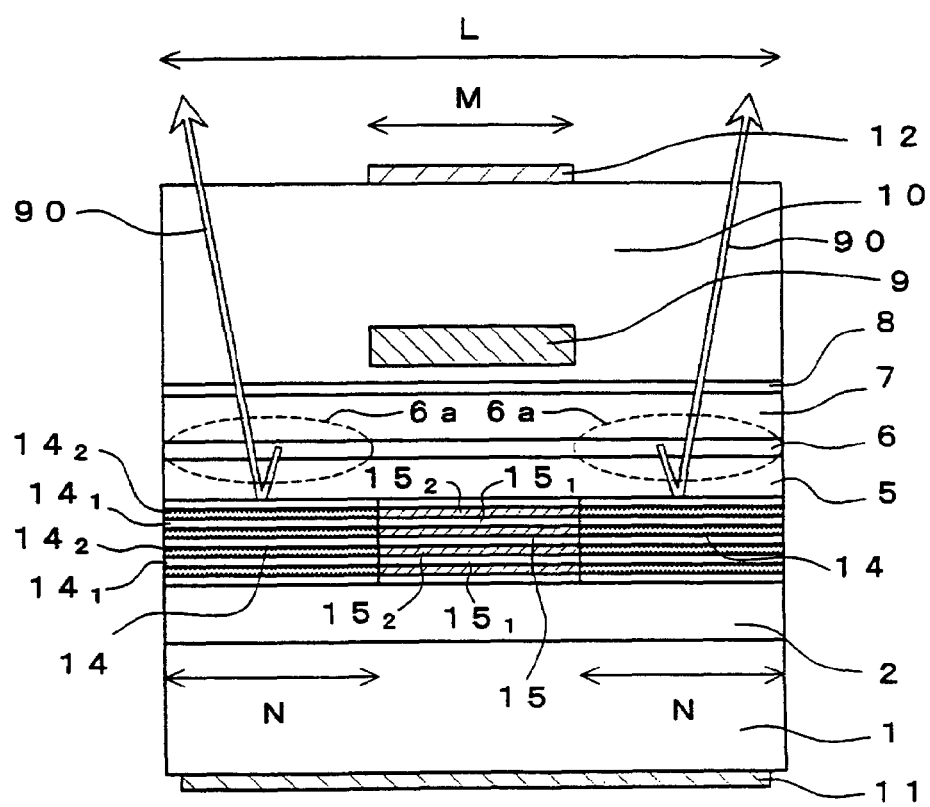
FIG. 7 is a sectional view showing the constitution of an LED according to a second embodiment of the invention.

FIG. 7 shows a cross-sectional structure of a semiconductor LED according to a second embodiment. This embodiment is characterized in that a main reflecting part of the first light-reflecting layer is formed of a multilayer film in which a pair of $AlO_y$ layer and AlGaAs layer are alternately stacked to a plurality of pairs.

This LED includes, on an n-type GaAs substrate 1, an n-type GaAs buffer layer (e.g., thickness: 0.5 μm; dopant concentration: $5 \times 10^{17}$ cm$^{-3}$) 2, an n-type AlAs/$Al_xGa_{1-x}$As conductive-type light-reflecting layer (e.g., x=0.65; dopant concentration: $5 \times 10^{17}$ cm$^{-3}$) 15 as a sub reflecting part and an $AlO_y$/$Al_xGa_{1-x}$As oxide light-reflecting layer 14 as a main reflecting part, which adjoin along the layer direction as a first light-reflecting layer. The n-type AlAs/$Al_xGa_{1-x}$As conductive-type light-reflecting layer 15 as the sub reflecting part is disposed at a center region of the chip, and the $AlO_y$/$Al_xGa_{1-x}$As oxide light-reflecting layer 14 as the main reflecting part is disposed at a peripheral region of the chip so as to surround the conductive-type light-reflecting layer 15. This LED further includes thereon an $(Al_xGa_{1-x})_{0.51}In_{0.49}P$ lower cladding layer ($0 \leq x \leq 1$, e.g. x=1.0; thickness: 1.5 μm; dopant concentration: $5 \times 10^{17}$ cm$^{-3}$) 5, a p-type $(Al_xGa_{1-x})_vIn_{1-v}P$ active layer (e.g., x=0.42; thickness: 0.6 μm; dopant concentration: $1 \times 10^{17}$ cm$^{-3}$) 6; a p-type $(Al_xGa_{1-x})_{0.51}In_{0.49}P$ upper cladding layer ($0 \leq x \leq 1$, e.g. x=1.0; thickness: 1.0 μm; dopant concentration: $5 \times 10^{17}$ cm$^{-3}$) 7, and a p-type $(Al_xGa_{1-x})_vIn_{1-v}P$ intermediate layer (x=0.2; v=0.4; thickness: 0.15 μm; dopant concentration: $1 \times 10^{18}$ cm$^{-3}$) 8, in this order. This LED includes further thereon a p-type $(Al_xGa_{1-x})_vIn_{1-v}P$ current spreading layer (x=0.05; v=0.05; total thickness: 8.5 μm; dopant concentration: $5 \times 10^{18}$ cm$^{-3}$) 10, and an n-type GaP current blocking layer (thickness: 0.3 μm; dopant concentration: $1 \times 10^{18}$ cm$^{-3}$) 9 which is formed at a central region in this current spreading layer and which serves to block electric current. Reference numeral 11 denotes an n-side electrode, and 12 denotes a p-side electrode.

This LED is fabricated by the following process:

(i) All over an n-type GaAs substrate 1, are deposited, in an order given below, an n-type GaAs buffer layer (e.g., thickness: 0.5 μm; dopant concentration: $5 \times 10^{17}$ cm$^{-3}$) 2, an n-type AlAs/$Al_xGa_{1-x}$As conductive-type light-reflecting layer (e.g., x=0.65; dopant concentration: $5 \times 10^{17}$ cm$^{-3}$) 15, an $(Al_xGa_{1-x})_{0.51}In_{0.49}P$ lower cladding layer ($0 \leq x \leq 1$, e.g. x=1.0; thickness: 1.5 μm; dopant concentration: $5 \times 10^{17}$ cm$^{-3}$) 5; a p-type $(Al_xGa_{1-x})_vIn_{1-v}P$ active layer (e.g., x=0.42; thickness: 0.6 μr; dopant concentration: $1 \times 10^{17}$ cm$^{-3}$) 6; a p-type $(Al_xGa_{1-x})_{0.51}In_{0.49}P$ upper cladding layer ($0 \leq x \leq 1$, e.g. x=1.0; thickness: 1.0 μm; dopant concentration: $5 \times 10^{17}$ cm$^{-3}$) 7, and a p-type $(Al_xGa_{1-x})_vIn_{1-v}P$ intermediate layer (x=0.2; v=0.4; thickness: 0.15 μm; dopant concentration: $1 \times 10^{18}$ cm$^{-3}$) 8.

It is noted here that the n-type AlAs/$Al_xGa_{1-x}$As conductive-type light-reflecting layer 15 is made up by stacking alternately AlAs layer $15_2$ as an Al rich layer and $Al_xGa_{1-x}$As layer $15_1$.

(ii) Next, on the p-type $(Al_xGa_{1-x})_vIn_{1-v}P$ intermediate layer 8, are grown a p-type $(Al_xGa_{1-x})_vIn_{1-v}P$ current spreading layer (x=0.05; v=0.05; thickness: 1.5 μm; dopant concentration: $5 \times 10^{18}$ cm$^{-3}$) 10, and further thereon an n-type GaP current blocking layer (thickness: 0.3 μm; dopant concentration: $1 \times 10^{18}$ cm$^{-3}$) 9. Thereafter, the n-type GaP current blocking layer 9 is subjected to selective etching by photolithography process so as to be patterned into an M=100 μm square to 150 μm square, with a current path for applied electric current formed therearound. Subsequently, a p-type $(Al_xGa_{1-x})_vIn_{1-v}P$ current spreading layer (x=0.05; v=0.05; thickness: 7 μm; dopant concentration $5 \times 10^{18}$ cm$^{-3}$) 10 is regrown.

(iii) Next, a metal layer to serve as an electrode is provided on the p side, and subject to selective etching by photolithography so that the electrode 12 is patterned into an M=100 μm square to 150 μm square in alignment with the position of the current blocking layer 9. Thereafter, the substrate 1 is thinly polished to a thickness of about 120 μm from its rear face side, and an electrode 11 is formed also on the n side. Then, in the same manner as in the first embodiment, the wafer is divided into L=280 μm square chips.

(iv) Subsequently, the chip side faces are exposed to the air, and thereafter the individual AlAs layers $15_2$ constituting the n-type AlAs/$Al_xGa_{1-x}$As conductive-type light-reflecting layer 15 are oxidized from the end portions of the side faces in the same manner as in the first embodiment, thereby making peripheral portions of the original AlAs layers $15_2$ changed into $AlO_y$ layers $14_2$, respectively. That is, peripheral portion out of the original n-type AlAs/$Al_xGa_{1-x}$As conductive-type light-reflecting layer 15 is changed into an $AlO_y$/$Al_xGa_{1-x}$As oxide light-reflecting layer 14 having a structure in which $AlO_y$ layer $14_2$ as a low-refractive-index material layer and $Al_xGa_{1-x}$As layer $15_1$ (this is expressed as "$14_1$" in the figure) as a high-refractive-index material layer are alternately stacked to a plurality. The layer-direction size (depth of oxidation) N of this $AlO_y$/$Al_xGa_{1-x}$As oxide light-reflecting layer 14 depends on the temperature and time of this oxidation. This layer-direction size N, as in the first embodiment, is desirably set so as to satisfy the condition:

$$N \leq (L-M)/2,$$

where L is the length of one side of the chip size and M is the length of one side of the current blocking layer or electrode. In this embodiment, as in the first embodiment, the chips are kept in the oxide forming equipment at 400° C. for 3 hours so that the layer-direction size N of the $AlO_y$/$Al_xGa_{1-x}$As oxide light-reflecting layer 14 becomes 80 μm. As to the refractive index of the resulting $AlO_y$/$Al_xGa_{1-x}$As oxide light-reflecting layer 14, the refractive index of the $AlO_y$ layer $14_2$ as the low-refractive-index material layer is as low as 1.9 (the refractive index of the original AlAs layer $15_2$ is 3.1). Meanwhile, the refractive index of the $Al_xGa_{1-x}$As layer $15_1$ (i.e. "$14_1$") as the high-refractive-index material layer remains unchanged, being 3.4. This is because the $Al_xGa_{1-x}$As layer as the high-refractive-index material layer, whose Al composition of 0.6 is lower as compared with AlAs, is transformed into oxide only at its portions around side-face end portions of the chip under the above conditions.

As shown above, the resulting $AlO_y/Al_xGa_{1-x}As$ oxide light-reflecting layer 14 becomes a distributed Bragg reflector layer having a large refractive index difference of 1.5 between low-refractive-index material layer and high-refractive-index material layer. Whereas 10 pairs of low-refractive-index material layer and high-refractive-index material layer generally yield a photoreflection-layer reflectance of about 55%, only 5 pairs yielded a photoreflection-layer reflectance of 99% in this embodiment.

Also, when the individual AlAs layers constituting the n-type $AlAs/Al_xGa_{1-x}As$ conductive-type light-reflecting layer 15 are oxidized from side-face end portions as shown above, the distributed Bragg light-reflecting layer 14 can be formed stably and easily at peripheral regions of the chips, with high mass-productivity. Still, since the remaining portion of the original n-type $AlAs/Al_xGa_{1-x}As$ conductive-type light-reflecting layer 15 that is not changed into the $AlO_y$ layer is made coincident in configuration with the current blocking layer 9, a larger amount of electric current flows through the peripheral region of the chip corresponding to the $AlO_y/Al_xGa_{1-x}As$ oxide light-reflecting layer 14. Therefore, a larger amount of light is generated at a peripheral portion 6a of the active layer 6. Since reflectance of the light-reflecting layer is improved at peripheral regions of the chips, light 90 generated at the peripheral portion 6a of the active layer 6 is reflected at high efficiency so as to be extracted outside effectively without being interrupted by the electrode 12. Actually, in this embodiment, chip luminous intensity at the emission wavelength of 570 nm was able to be improved from normal 35 mcd to 60 mcd. Further, the half-value width of the reflection spectrum increased fivefold or more, compared with the half-value width of about 20 nm of normal light-reflecting layers. Thus, even with variations in layer thickness of the light-reflecting layer 15 in mass production, reflectance and reflection spectrum were less liable to variations, so that the uniformity of luminous intensity was improved and the yield was also improved.

Third Embodiment

An LED of the third embodiment, which is not shown, is characterized in that the material of the first light-reflecting layer in the semiconductor light-emitting device of the second embodiment shown in FIG. 7 is changed.

The LED of this embodiment includes an n-type $AlInP/(Al_xGa_{1-x})_vIn_{1-v}P$ conductive-type light-reflecting layer as a sub reflecting part and an n-type $AlO_y/(Al_xGa_{1-x})_vIn_{1-v}P$ oxide light-reflecting layer as a main reflecting part, which adjoin along the layer direction as a first light-reflecting layer. The rest of the constituent elements are the same as in the semiconductor light-emitting device of the second embodiment.

In this case, the n-type $AlInP/(Al_xGa_{1-x})_vIn_{1-v}P$ conductive-type light-reflecting layer as the sub reflecting part is made up as a distributed Bragg reflector layer by stacking a pair of AlInP layer and $(Al_xGa_{1-x})_vIn_{1-v}P$ layer to a plurality. Thicknesses of the AlInP layer and the $(Al_xGa_{1-x})_vIn_{1-v}P$ layer constituting each pair are each set so as to become a quarter of the emission wavelength $\lambda$.

The LED of this embodiment is fabricated by the same procedure as in the case of the LED of the second embodiment. In particular, the individual n-type $AlO_y$ layers included in the main reflecting part of the first light-reflecting layer are formed by setting the individual AlInP layers included in the sub reflecting part into oxide forming equipment, and oxidizing them from end-face side portions of the chips as in the first embodiment. Whereas the refractive index of the original AlInP layer 3 is 3.1, the refractive index of the $AlO_y$ layer 13 resulting from the oxidation is as low as 1.9. Whereas the reflectance of the light-reflecting layer is about 50% in the prior art, the reflectance of the light-reflecting layer at peripheral regions of the chips was able to be improved to 99% or more in this embodiment.

In the case where the material to be oxidized is AlInP as in this embodiment, oxidation progresses slower than in the case where the material to be oxidized is the AlAs layer. However, adopting GaInP as the other material to be paired allows prolonged time to be taken for the oxidization, because GaInP is not oxidized at all. As a result, a better controllability for the layer-direction size (depth of oxidation) N of oxidized portions can be obtained. Further, the half-value width of the reflection spectrum increased threefold or more, compared with the half-value width (about 20 nm) of normal light-reflecting layers. Thus, even with variations in layer thickness of the individual layers constituting the first light-reflecting layer in mass production, reflectance and reflection spectrum are less liable to variations. As a result of this, the uniformity of luminous intensity was improved and the yield was also improved.

Fourth Embodiment

Figure 8:
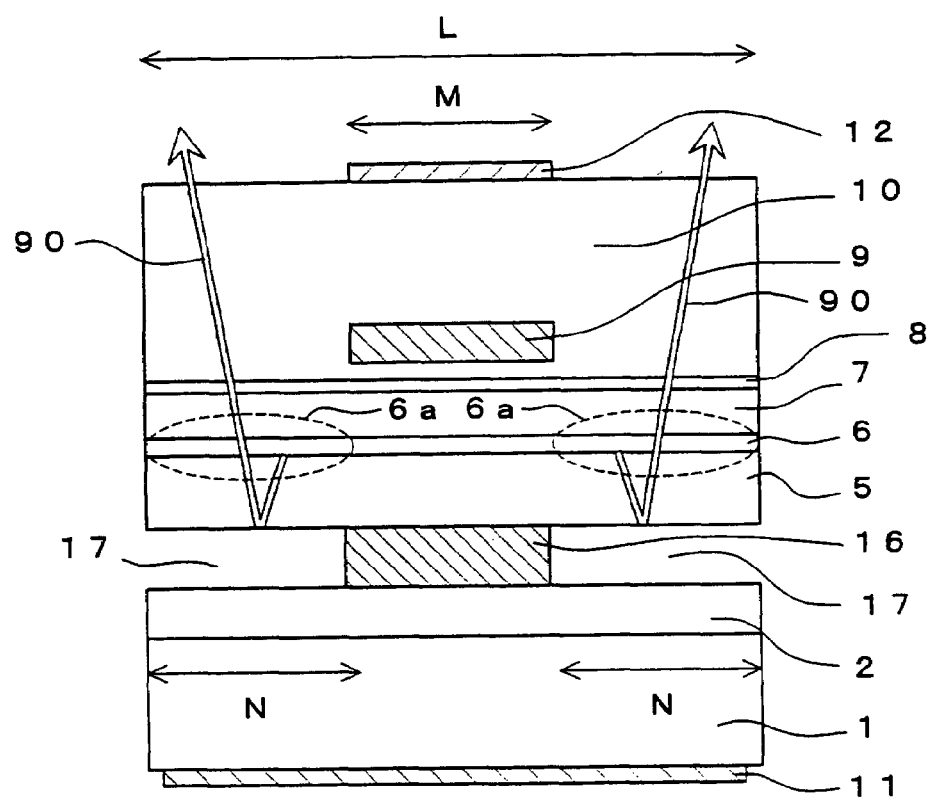
FIG. 8 is a sectional view showing the constitution of an LED according to a fourth embodiment of the invention.

FIG. 8 shows a cross-sectional structure of a semiconductor LED according to a fourth embodiment. This embodiment is characterized in that the main reflecting part of the first light-reflecting layer is formed of space.

This LED includes, on an n-type GaAs substrate 1, an n-type GaAs buffer layer (e.g., thickness: 0.5 µm; dopant concentration: $5\times10^{17}$ cm$^{-3}$) 2, an n-type AlAs conductive layer 16 as a sub reflecting part and a space region 17 as a main reflecting part, which adjoin along the layer direction as a first light-reflecting layer. The n-type AlAs conductive layer 16 as the sub reflecting part is disposed at a center region of the chip, and the space region 17 as the main reflecting part is disposed at a peripheral region of the chip so as to surround the conductive layer 16. In other words, this embodiment is an embodiment in which the first light-reflecting layer is so formed that a portion of the n-type AlAs conductive layer 16 corresponding to the chip periphery is removed from an all-over stacked n-type AlAs conductive layer 16. This LED further includes thereon an $(Al_xGa_{1-x})_{0.51}In_{0.49}P$ lower cladding layer ($0\leq x\leq 1$, e.g. x=1.0; thickness: 1.0 µm; dopant concentration: $5\times10^{17}$ cm$^{-3}$) 5, a p-type $(Al_xGa_{1-x})_vIn_{1-v}P$ active layer (e.g. x=0.42; thickness: 0.6 µm; dopant concentration: $1\times10^{17}$ cm$^{-3}$) 6; a p-type $(Al_xGa_{1-x})_{0.51}In_{0.49}P$ upper cladding layer ($0\leq x\leq 1$, e.g. x=1.0; thickness: 2.0 µm; dopant concentration: $5\times10^{17}$ cm$^{-3}$) 7, and a p-type $(Al_xGa_{1-x})_vIn_{1-v}P$ intermediate layer (x=0.2; v=0.4; thickness: 0.15 µm; dopant concentration: $1\times10^{18}$ cm$^{-3}$) 8, in this order. This LED includes further thereon a p-type $(Al_xGa_{1-x})_vIn_{1-v}P$ current spreading layer (x=0.05; v=0.05; total thickness: 8.5 µm; dopant concentration: $5\times10^{18}$ cm$^{-3}$) 10, and an n-type GaP current blocking layer (thickness: 0.3 µm; dopant concentration: $1\times10^{18}$ cm$^{-3}$) 9 which is formed at a central region in this current spreading layer and which serves to block electric current. Reference numeral 11 denotes an n-side electrode, and 12 denotes a p-side electrode.

This LED is fabricated by the following process:

(i) All over an n-type GaAs substrate 1, are deposited, in an order given below, an n-type GaAs buffer layer (e.g., thickness: 0.5 µm; dopant concentration: $5\times10^{17}$ cm$^{-3}$) 2, an n-type AlAs conductive layer 16 as an Al rich layer, an $(Al_xGa_{1-x})_{0.51}In_{0.49}P$ lower cladding layer ($0\leq x\leq 1$, e.g. x=1.0; thickness: 1.0 µm; dopant concentration: $5\times10^{17}$ cm$^{-3}$) 5; a p-type $(Al_xGa_{1-x})_vIn_{1-v}P$ active layer (e.g. x=0.42; thickness: 0.6 µm; dopant concentration: $1\times10^{17}$ cm$^{-3}$) 6; a p-type $(Al_xGa_{1-x})_{0.51}In_{0.49}P$ upper cladding layer ($0\leq x\leq 1$, e.g. x=1.0; thickness: 2.0 µm; dopant concentration: $5\times10^{17}$ cm$^{-3}$) 7, and a p-type $(Al_xGa_{1-x})_vIn_{1-v}P$ intermediate layer (x=0.2; v=0.4; thickness: 0.15 µm; dopant concentration: $1\times10^{18}$ cm$^{-3}$) 8.

(ii) Next, on the p-type $(Al_xGa_{1-x})_vIn_{1-v}P$ intermediate layer 8, are grown a p-type $(Al_xGa_{1-x})_vIn_{1-v}P$ current spreading layer (x=0.05; v=0.05; thickness: 1.5 µm; dopant concentration: $5\times10^{18}$ cm$^{-3}$) 10, and further thereon an n-type GaP current blocking layer (thickness: 0.3 µm; dopant concentration: $1\times10^{18}$ cm$^{-3}$) 9. Thereafter, the n-type GaP current blocking layer 9 is subjected to selective etching by photolithography process so as to be patterned into an M=100 µm square to 150 µm square, with a current path for applied electric current formed therearound. Subsequently, a p-type $(Al_xGa_{1-x})_vIn_{1-v}P$ current spreading layer (x=0.05; v=0.05; thickness: 7 µm; dopant concentration $5\times10^{18}$ cm$^{-3}$) 10 is regrown.

(iii) Next, a metal layer to serve as an electrode is provided on the p side, and subject to selective etching by photolithography so that the electrode 12 is patterned into an M=100 µm square to 150 µm square in alignment with the position of the current blocking layer 9. Thereafter, the substrate 1 is thinly polished to a thickness of about 120 µm from its rear face side, and an electrode 11 is formed also on the n side (the substrate in this state is called wafer, normally about 50 mm dia. sized). Then, in the same manner as in the first embodiment, the wafer is divided into L=280 µm square chips.

(iv) Subsequently, the chip side faces are exposed to the air, and thereafter the AlAs layer 16 is oxidized from the end portions of the side faces in the same manner as in the first embodiment, thereby making peripheral portions of the original AlAs layer 16 changed into AlO$_y$ layers, respectively. The layer-direction size (depth of oxidation) N of this AlO$_y$/Al$_x$Ga$_{1-x}$As oxide light-reflecting layer 14 depends on the temperature and time of this oxidation. This layer-direction size N, as in the first embodiment, is desirably set so as to satisfy the condition:

$$N\leq (L-M)/2,$$

where L is the length of one side of the chip size and M is the length of one side of the current blocking layer or electrode. In this embodiment, the chips are kept in the oxide forming equipment at 400° C. for 3 hours so that the layer-direction size N of the AlO$_y$ layer becomes 80 µm. Whereas the refractive index of the original semiconductor layer is 2.9 to 3.5, the refractive index of the AlO$_y$ layer resulting from the oxidation is as low as 1.9.

(v) In this embodiment, in order to obtain a further lower reflectance, only the AlO$_y$ layer formed at a peripheral portion of the original AlAs conductive layer 16 is selectively etched with hydrofluoric acid or ammonium fluoride solution or hydrofluoric acid diluted twofold to tenfold, and thereby removed, in the chip state.

As shown above, this LED is fabricated by the same manufacturing process as the semiconductor light-emitting device of the first embodiment, except that after the oxidation of the AlAs layer 16, the AlO$_y$ layer formed at the peripheral portion is removed.

The refractive index of the space region 17 formed by the removal of AlO$_y$ is almost 1, whether the region is in a vacuum or in the presence of inert gas such as air or nitrogen. Accordingly, a nearly total reflection state was able to be obtained at the chip peripheral portion on the rear side of the active layer 6, so that a substantially almost 100% reflectance was able to be obtained.

Actually, in this embodiment, the chip luminous intensity at the emission wavelength of 570 nm was able to be improved from normal 35 mcd to 60 mcd. Further, since the main reflecting part of the first light-reflecting layer is the space region 17, which does not need to be filled with any material, the optical reflectance on the rear face side remains unchanged even if the growth rate is changed due to changes in growth conditions. As a result, reflectance and reflection spectrum were less liable to variations, so that the uniformity of luminous intensity was improved and the yield was also improved.

Fifth Embodiment

Figure 9:
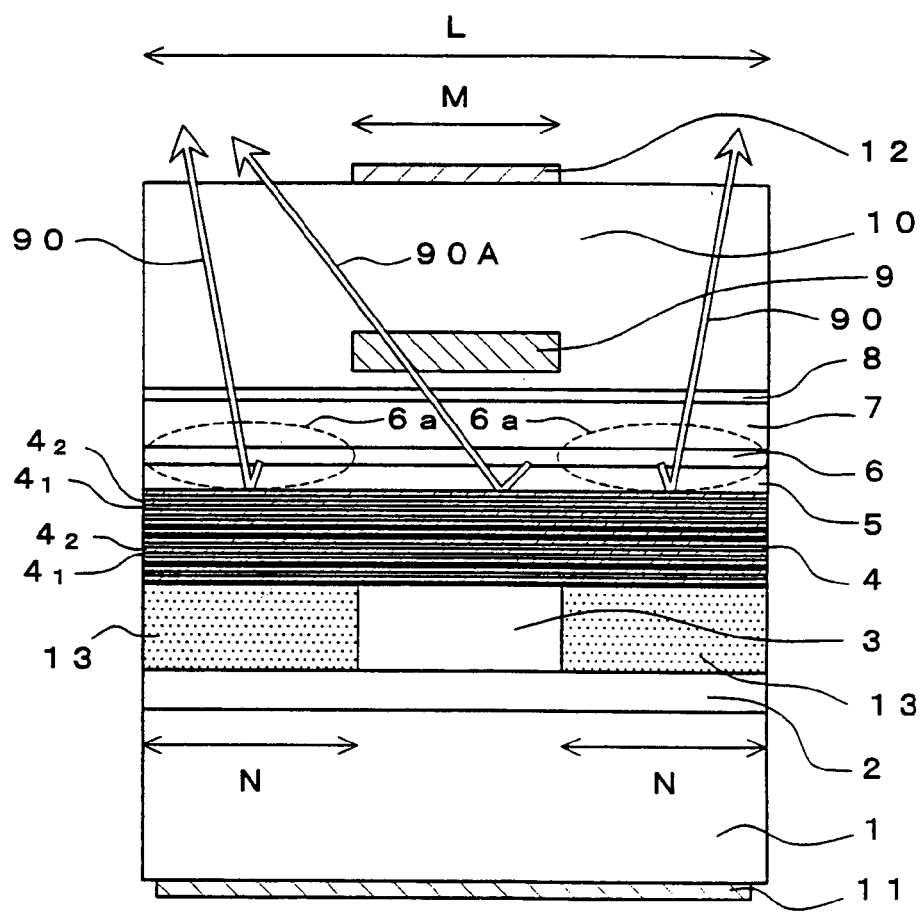
FIG. 9 is a sectional view showing the constitution of an LED according to a fifth embodiment of the invention.

FIG. 9 shows a cross-sectional structure of a semiconductor LED according to a fifth embodiment. This embodiment is characterized in that a second light-reflecting layer is provided between the first light-reflecting layer and the active layer.

This LED includes, on an n-type GaAs substrate 1, an n-type GaAs buffer layer (e.g., thickness: 0.5 µm; dopant concentration: $5\times10^{17}$ cm$^{-3}$) 2, an n-type AlAs conductive layer 3 as a sub reflecting part and an AlO$_y$ oxide layer 13 as a main reflecting part, which adjoin along the layer direction as a first light-reflecting layer. The n-type AlAs conductive layer 3 as the sub reflecting part is disposed at a center region of the chip, and the AlO$_y$ oxide layer 13 as the main reflecting part is disposed at a peripheral region of the chip so as to surround the conductive layer 3. This LED further includes thereon an n-type AlInP/(Al$_x$Ga$_{1-x}$)$_v$In$_{1-v}$P light-reflecting layer 4 as a second light-reflecting layer. This light-reflecting layer 4 is made up by stacking a pair of an AlInP layer 4$_2$ as a low-refractive-index material layer and an (Al$_x$Ga$_{1-x}$)$_v$In$_{1-v}$P layer 4$_1$ as a high-refractive-index material layer alternately to a plurality as a distributed Bragg reflector layer. As in the first embodiment of semiconductor LED, this LED further includes thereon an $(Al_xGa_{1-x})_{0.51}In_{0.49}P$ lower cladding layer ($0\leq x\leq 1$, e.g. x=1.0; thickness: 1.0 µm; dopant concentration: $5\times10^{17}$ cm$^{-3}$) 5, a p-type $(Al_xGa_{1-x})_vIn_{1-v}P$ active layer ($0\leq x\leq 1$, e.g. x=0.42; thickness: 0.6 µm; dopant concentration: $1\times10^{17}$ cm$^{-3}$) 6; a p-type $(Al_xGa_{1-x})_{0.51}In_{0.49}P$ upper cladding layer ($0\leq x\leq 1$, e.g. x=1.0; thickness: 1.0 µm; dopant concentration: $5\times10^{17}$ cm$^{-3}$) 7, and a p-type $(Al_xGa_{1-x})_vIn_{1-v}P$ intermediate layer (x=0.2; v=0.4; thickness: 0.15 µm; dopant concentration: $1\times10^{18}$ cm$^{-3}$) 8, in this order. This LED includes further thereon a p-type $(Al_xGa_{1-x})_vIn_{1-v}P$ current spreading layer (x=0.05; v=0.05; total thickness: 8.5 µm; dopant concentration: $5\times10^{18}$ cm$^{-3}$) 10, and an n-type GaP current blocking layer (thickness: 0.3 µm; dopant concentration: $0.1\times10^{18}$ cm$^{-3}$) 9 which is formed at a central region in this current spreading layer and which serves to block electric current. Reference numeral 11 denotes an n-side electrode, and 12 denotes a p-side electrode.

This LED is fabricated by the following process:

(i) All over an n-type GaAs substrate 1, are deposited, in an order given below, an n-type GaAs buffer layer (e.g., thickness: 0.5 μm; dopant concentration: $5×10^{17}$ cm$^{-3}$) 2, an n-type AlAs conductive layer 3, an n-type AlInP/(Al$_x$Ga$_{1-x}$)$_v$In$_{1-v}$P light-reflecting layer 4, an (Al$_x$Ga$_{1-x}$)$_{0.51}$In$_{0.49}$P lower cladding layer (0≦x≦1, e.g. x=1.0; thickness: 1.0 μm; dopant concentration: $5×10^{17}$ cm$^{-3}$) 5; a p-type (Al$_x$Ga$_{1-x}$)$_v$In$_{1-v}$P active layer (0≦x≦1, e.g. x=0.42; thickness: 0.6 μm; dopant concentration: $1×10^{17}$ cm$^{-3}$) 6 as an light-emitting layer; a p-type (Al$_x$Ga$_{1-x}$)$_{0.51}$In$_{0.49}$P upper cladding layer (0≦x≦1, e.g. x=1.0; thickness: 1.0 μm; dopant concentration: $5×10^{17}$ cm$^{-3}$) 7, and a p-type (Al$_x$qjGa$_{1-x}$)$_v$In$_{1-v}$P intermediate layer (x=0.2; v=0.4; thickness: 0.15 μm; dopant concentration: $1×10^{18}$ cm$^{-3}$) 8.

As already described, the n-type AlInP/(Al$_x$Ga$_{1-x}$)$_v$In$_{1-v}$P light-reflecting layer 4 is made up by stacking a pair of AlInP layer 4$_2$ and (Al$_x$Ga$_{1-x}$)$_v$In$_{1-v}$P layer 4$_1$ alternately as a distributed Bragg reflector layer. Layer thicknesses of the n-type AlAs conductive layer 3 and the n-type AlInP/(Al$_x$Ga$_{1-x}$)$_v$In$_{1-v}$P light-reflecting layer 4 are each set so as to become a quarter of the emission wavelength λ, in principle. However, taking into consideration that the AlAs conductive layer 3 is oxidized so that the refractive index will be lowered in later-described process, only the layer closest to the AlAs conductive layer 3 out of the n-type AlInP/(Al$_x$Ga$_{1-x}$)$_v$In$_{1-v}$P light-reflecting layer 4 is set to a layer thickness half the emission wavelength λ.

(ii) Next, on the p-type (Al$_x$Ga$_{1-x}$)$_v$In$_{1-v}$P intermediate layer 8, are grown a p-type (Al$_x$Ga$_{1-x}$)$_v$In$_{1-v}$P current spreading layer (x=0.05; v=0.05; thickness: 1.5 μm; dopant concentration: $5×10^{18}$ cm$^{-3}$) 10, and further thereon an n-type GaP current blocking layer (thickness: 0.3 μm; dopant concentration: $1×10^{18}$ cm$^{-3}$) 9. Thereafter, the n-type GaP current blocking layer 9 is subjected to selective etching by photolithography process so as to be patterned into an M=100 μm square to 150 μm square, with a current path for applied electric current formed therearound. Subsequently, a p-type (Al$_x$Ga$_{1-x}$)$_v$In$_{1-v}$P current spreading layer (x=0.05; v=0.05; thickness: 7 μm; dopant concentration $5×10^{18}$ cm$^{-3}$) 10 is regrown.

(iii) Next, a metal layer to serve as an electrode is provided on the p side, and subject to selective etching by photolithography so that the electrode 12 is patterned into an M=100 μm square to 150 μm square in alignment with the position of the current blocking layer 9. Thereafter, the substrate 1 is thinly polished to a thickness of about 120 μm from its rear face side, and an electrode 11 is formed also on the n side (the substrate in this state is called wafer, normally about 50 mm dia. sized). Then, in the same manner as in the first embodiment, the wafer is divided into L=280 μm square chips.

(iv) Subsequently, the chip side faces are exposed to the air, and thereafter the AlAs layer 3 is oxidized from the end portions of the side faces in the same manner as in the first embodiment, thereby making peripheral portions of the original AlAs layer 3 changed into AlO$_y$ layers 13, respectively. The layer-direction size (depth of oxidation) N of this AlO$_y$/Al$_x$Ga$_{1-x}$As oxide light-reflecting layer 14 depends on the temperature and time of this oxidation. This layer-direction size N, as in the first embodiment, is desirably set so as to satisfy the condition:

$N≦(L-M)/2$, where L is the length of one side of the chip size and M is the length of one side of the current blocking layer or electrode. In this embodiment, as in the first embodiment, the chips are kept in the oxide forming equipment at 400° C. for 3 hours so that the layer-direction size N of the AlO$_y$ layer becomes 80 μm.

As shown above, this LED is fabricated by the same manufacturing process as the semiconductor light-emitting device of the first embodiment, except that after the formation of the first light-reflecting layer including the AlO$_y$ layer 13 as the main reflecting part, the n-type AlInP/(Al$_x$Ga$_{1-x}$)$_v$In$_{1-v}$P light-reflecting layer 4 is formed thereon as the second light-reflecting layer.

Whereas the refractive index of the original AlAs layer 3 is 3.1, the refractive index of the AlO$_y$ layer 13 resulting from the oxidation is as low as 1.9. Whereas the reflectance of the light-reflecting layer is about 50% in the prior art, the reflectance of the light-reflecting layer at the peripheral regions of the chips was able to be improved to 99% or more in this embodiment.

Also, when the AlAs layer 3 is oxidized from side-face end portions as shown above so that the peripheral portion of the original AlAs layer 3 is changed into the AlO$_y$ layer 13, the AlO$_y$ layer can be formed stably and easily, with high mass-productivity. Still, since the remaining portion of the AlAs layer 3 that is not changed into the AlO$_y$ layer is made coincident in configuration with the current blocking layer 9, a larger amount of electric current flows through the peripheral region of the chip corresponding to the AlO$_y$ layer 13. Therefore, a larger amount of light is generated at a peripheral portion 6a of the active layer 6. Since reflectance of the light-reflecting layer is improved at peripheral regions of the chips, light 90 generated at the peripheral portion 6a of the active layer 6 is reflected at high efficiency so as to be extracted outside effectively without being interrupted by the electrode 12.

Further, since the light-reflecting layer is double structured of the first light-reflecting layer 3, 13 and the second light-reflecting layer 4, even light 90A radiated from the active layer 6 toward the rear face (substrate) side so as to sneak to just under the electrode 12 can be effectively reflected toward the top face side so as to be extracted outside.

Actually, in this embodiment, chip luminous intensity at the emission wavelength of 570 nm was able to be improved from normal 35 mcd to 60 mcd. Further, the half-value width of the reflection spectrum increased threefold or more, compared with the half-value width of about 20 nm of normal light-reflecting layers. Thus, even with variations in layer thickness of the light-reflecting layer 4 in mass production, reflectance and reflection spectrum were less liable to variations, so that the uniformity of luminous intensity was improved and the yield was also improved.

Although the foregoing embodiments have been described on a case of (Al$_x$Ga$_{1-x}$)$_v$In$_{1-v}$P-based LEDs, the same effects can be produced also with other LEDs, such as AlGaAs- or InGaAsP-based LEDs, or InGaAs- or GaInN-based LEDs. Further, the material to be changed into the AlO$_y$ layer is not limited to Al$_x$Ga$_{1-x}$As or the like, and the same effects can be obtained also by such materials as Al$_x$Ga$_{1-x}$P, Al$_x$In$_{1-x}$P or Al$_x$In$_{1-x}$As.

Furthermore, although the foregoing embodiments have been described on a semiconductor light-emitting device including a GaAs substrate and an (Al$_x$Ga$_{1-x}$)$_v$In$_{1-v}$P active layer, which are generally equal in lattice constant to each other, yet the present invention is applicable also to those including other materials.

For instance, when sapphire is used for the substrate and the active layer is formed by (Al$_w$Ga$_{1-w}$)$_v$In$_{1-v}$N, it is appropriate to use (Al$_x$Ga$_{1-x}$)$_v$In$_{1-v}$N for the conductive layer. It is also possible to use an $(Al_xGa_{1-x})_yIn_{1-y}N/(Al_zGa_{1-z})_yIn_{1-y}N$ semiconductor multilayer film. In these cases, it is conditioned that $0<w<z<x\leq 1$, $0<v<1$. The conditions for oxidizing the AlGaInN film may be changed as required. As for the reason of this, although sapphire of the substrate and $(Al_w Ga_{1-w})_vIn_{1-v}N$ of the active layer are utterly different in lattice constant from each other, the crystal thin film formed on the substrate, given a normal chip size, exhibits the generally same properties as when it is in lattice matching with the substrate.

Furthermore, Si or GaN may also be used for the substrate. It is needless to say that the same effects can be obtained also when $Al_xGa_{1-x}As$, $(Al_xGa_{1-x})_yIn_{1-y}As$, $(Al_xGa_{1-x})_yIn_{1-y}Sb$ or the like is used for the active layer.

Sixth Embodiment

Integrating a high-intensity semiconductor light-emitting device as described above with lenses allows an LED lamp of high luminous intensity to be obtained.

Figure 14:
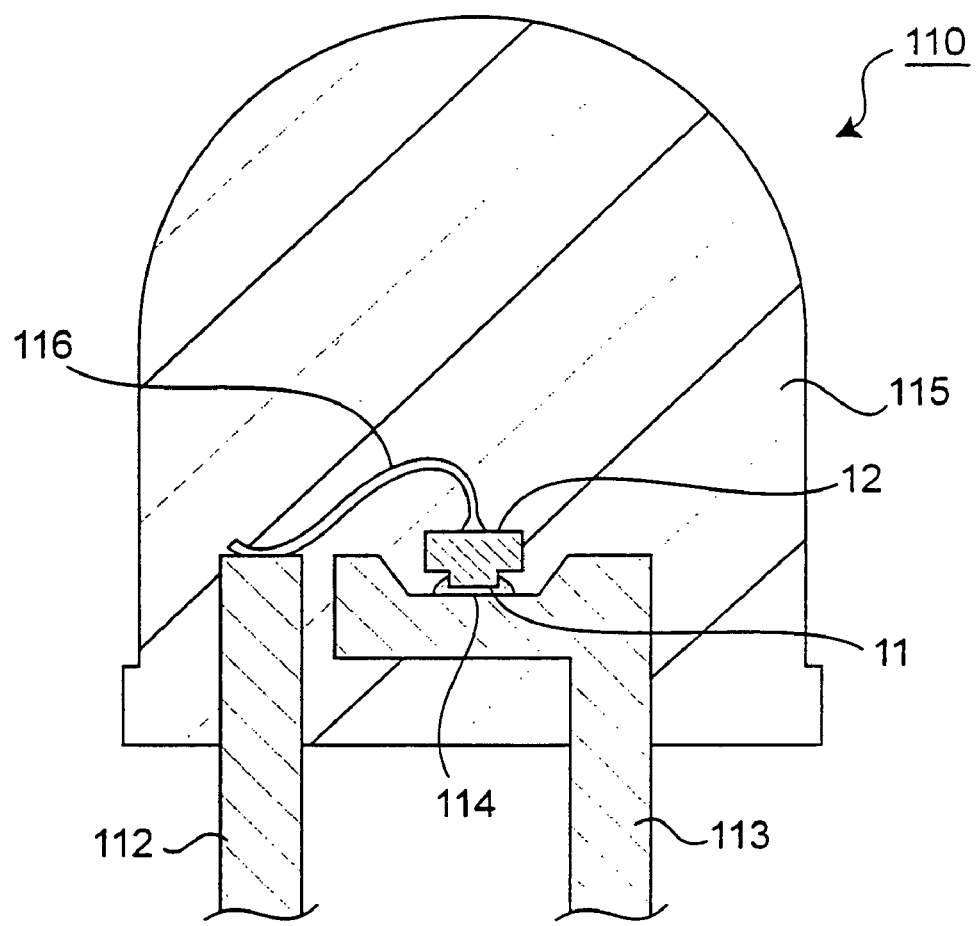
FIG. 14 is a view showing an LED lamp made up with the use of the semiconductor light-emitting device according to the present invention.

FIG. 14 shows an LED lamp 110 of a sixth embodiment using a semiconductor light-emitting device of the present invention.

This LED lamp 110 includes a semiconductor light-emitting device (chip) 114 to which the present invention is applied, a first lead 113 on which the semiconductor light-emitting device 114 is mounted, and a second lead 112 disposed so as to be spaced from the first lead 113. A rear face (n-side electrode 11) of the semiconductor light-emitting device 114 is bonded to a leading end of the first lead 113 via electrically conductive adhesive such as silver paste. A p-side electrode 12 of the semiconductor light-emitting device 114 is connected to a leading end of the second lead 112 by a metal wire 116. Then, the semiconductor light-emitting device 114 and portions of the first lead 113 and the second lead 112 near their leading ends are sealed by a transparent resin 115 composed of epoxy resin or the like. A fore end portion of the transparent resin 115 is in the form of a hemispherical-shaped lens so that light coming out from the semiconductor light-emitting device 114 toward the top surface (p-side electrode 12) side is radiated forward efficiently. Still, the semiconductor light-emitting device 114 exhibits higher brightness than conventional semiconductor light-emitting devices. Therefore, this LED lamp is enabled to show high luminous intensity.

As already described, since the semiconductor light-emitting device 114 has a light-reflecting layer between active layer and substrate, there occurs less light reflected from the side faces of the chips. Accordingly, even if the leading end of the first lead 113, on which the semiconductor light-emitting device 114 is mounted, is not formed into a reflector-equipped configuration as in the figure, high luminous intensity can be achieved.

In addition, it is also possible to provide one lamp in one unit with a plurality of semiconductor light-emitting devices differing in active layer material and therefore different in emission wavelength from each other. That is, the second lead 112 is provided to a quantity corresponding to the number of semiconductor light-emitting devices. Such a plurality of semiconductor light-emitting devices are disposed so as to be arrayed at the leading end of the common first lead 113. The p-side electrodes 12 of the individual semiconductor light-emitting devices are connected to their corresponding second leads 112 by Au wires, respectively. With such an arrangement, the plurality of semiconductor light-emitting devices having different emission wavelengths can be applied with electric current independently from each other. Accordingly, a high-intensity LED lamp which emit light in white and other various colors can be implemented.

Further, in order to achieve higher brightness, the lamp shown in FIG. 14 may be grouped in a plurality to make up an integrated lamp. Such an integrated lamp is suitable for traffic signals or the like to be used outdoors. In particular, the integrated lamp can be used for side lights or buoys of ships that are required to have high visibility.

Figure 15:
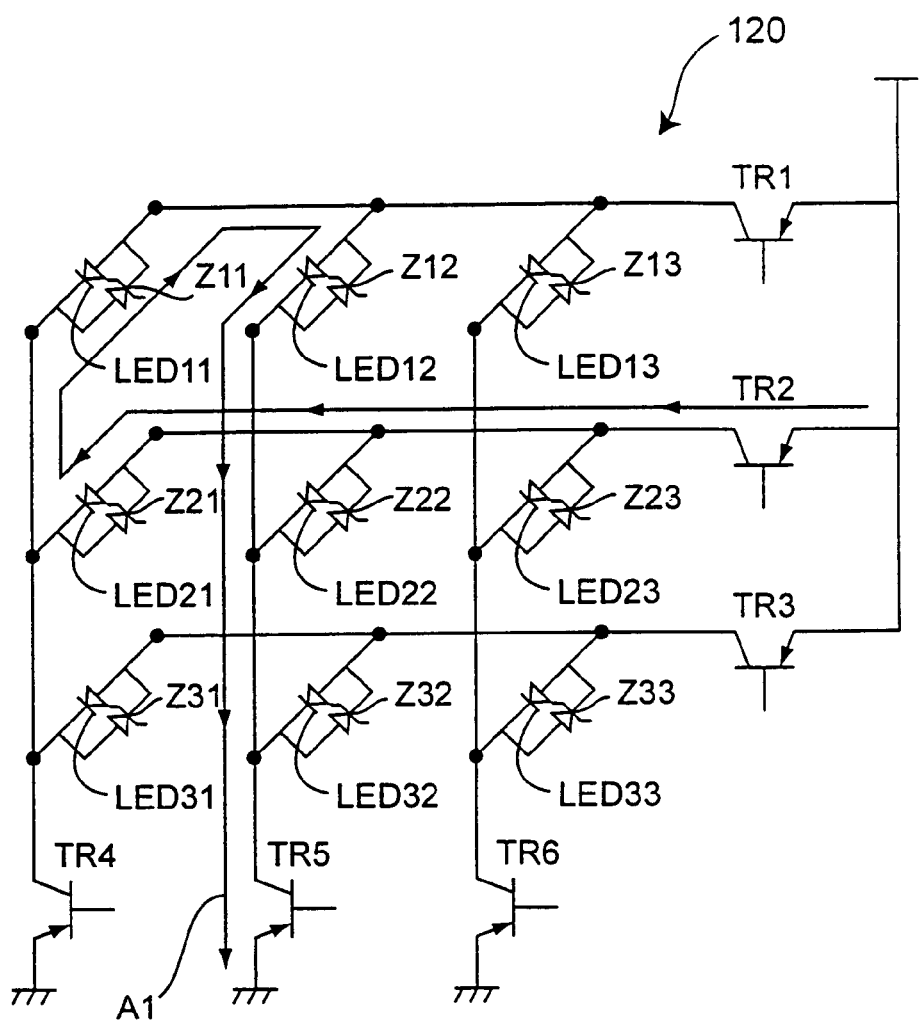
FIG. 15 is a view showing an electric circuit of a display panel made up with the use of the semiconductor light-emitting device according to the present invention.

Furthermore, the above-described semiconductor light-emitting devices may be disposed integrally in a matrix to make up a display panel 120 as an LED display unit. With such an arrangement, a display panel showing high visibility even outdoors can be implemented. FIG. 15 shows an electric circuit of such a display panel 120. In this case, reference characters LED 11, LED 12, . . . , LED 33 denote semiconductor light-emitting devices to which the present invention is applied. To the LED 11, LED 12, . . . , LED 33 are connected protective diodes Z11, Z12, . . . , Z33 in parallel for the prevention of electrostatic breakage of their corresponding LEDs, respectively. It is noted that reference characters TR1, . . . , TR6 denote transistors for use of driving the LEDs.

In this example, each one LED and one protective diode are integrally formed as one LED lamp. However, the LED is not limited to one in number, and a plurality of LEDs may be integrated. In this case, the plurality of LEDs and protective diodes are connected all in parallel. Further, the plurality of LEDs may be those having the same emission wavelength, in which case the brightness can be further enhanced.

This display panel 120 operates in the following way. For example, the LED 22, if desired, can be lit by turning on the transistor TR2, which connects to the LED 22 in the row direction, and the transistor TR5, which connects to the LED 22 in the column direction. In this case, if the protective diodes are one-way diodes, electric current flows along a route Al as shown in the figure, so that the LEDs 11, 12, 21 may also be mis-lit. For this reason, the protective diodes are desirably provided by two-way ones, i.e., protective diodes that do not permit electric current to pass therethrough unless the forward voltage becomes beyond a specified value, irrespective of the direction of voltage.

The LED to be lit can be selected arbitrarily. The LED to be lit may be set as plural ones, without being limited to one.

It is clear by the above description that a semiconductor light-emitting device according to the present invention is capable of effectively extracting light emitted from the active layer to the external.

Furthermore, a semiconductor light-emitting device manufacturing method according to the present invention is capable of fabricating such semiconductor light-emitting devices with high mass-productivity.

Still furthermore, an LED lamp and LED display according to the present invention can achieve higher brightness.

What is claimed is:

1. A method for manufacturing a semiconductor light-emitting device by stacking, on a semiconductor substrate, a plurality of layers including an active layer made of a semiconductor which generates light of a specified wavelength, the method comprising the steps of:

providing, between the semiconductor substrate and the active layer, an Al rich layer higher in Al ratio than any other layer among the plurality of layers;

dividing into chips a wafer in which the plurality of layers are stacked, thereby making a side face of the Al rich layer exposed; and oxidizing Al contained in the Al rich layer from the exposed side face, thereby making a peripheral portion of the Al rich layer changed into an $AlO_y$ layer.

2. The method for manufacturing a semiconductor light-emitting device according to claim 1, wherein
the step of oxidizing Al contained in the Al rich layer is carried out by leaving in a water vapor the chips in which the side face of the Al rich layer is exposed.

3. The method for manufacturing a semiconductor light-emitting device according to claim 2, wherein
the water vapor is introduced to the side face of the Al rich layer by an inert gas that has been passed through boiling water.

4. The method for manufacturing a semiconductor light-emitting device according to claim 2, wherein
the step of oxidizing Al contained in the Al rich layer is carried out in an atmosphere having a temperature of 300° C. to 400° C.

5. The method for manufacturing a semiconductor light-emitting device according to claim 1, further comprising the step of:
removing, by etching, the $AlO_y$ layer formed at the peripheral portion of the Al rich layer.

* * * * *